United States Patent
Park et al.

(10) Patent No.: US 9,337,151 B2
(45) Date of Patent: May 10, 2016

(54) SEMICONDUCTOR DEVICE

(71) Applicant: SAMSUNG ELECTRONICS CO., LTD., Suwon-si, Gyeonggi-do (KR)

(72) Inventors: Je-Min Park, Suwon-si (KR); Yoo-Sang Hwang, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/457,185

(22) Filed: Aug. 12, 2014

(65) Prior Publication Data
US 2015/0228573 A1    Aug. 13, 2015

(30) Foreign Application Priority Data

Feb. 10, 2014  (KR) .......................... 10-2014-0015120

(51) Int. Cl.
| H01L 29/68 | (2006.01) |
|---|---|
| H01L 21/768 | (2006.01) |
| H01L 29/94 | (2006.01) |
| H01L 21/4763 | (2006.01) |
| H01L 23/538 | (2006.01) |
| H01L 23/535 | (2006.01) |
| H01L 27/108 | (2006.01) |

(52) U.S. Cl.
CPC .......... *H01L 23/5386* (2013.01); *H01L 23/535* (2013.01); *H01L 27/10814* (2013.01); *H01L 27/10855* (2013.01); *H01L 27/10894* (2013.01)

(58) Field of Classification Search
CPC .................. H01L 2924/00; H01L 2924/0002; H01L 21/76831; H01L 21/76897; H01L 27/10888; H01L 27/10855; H01L 27/10885; H01L 2224/48247; H01L 2924/1305; H01L 2924/13091; H01L 29/66545; H01L 23/485

USPC .......... 257/208, 288, 297, 319, 773, E29.255, 257/E21.409; 438/129, 266, 299, 637
See application file for complete search history.

(56) References Cited

U.S. PATENT DOCUMENTS

| 8,252,641 | B2 | 8/2012 | Aoki | |
|---|---|---|---|---|
| 8,298,893 | B2 | 10/2012 | Kim | |
| 2009/0085083 | A1* | 4/2009 | Shin ................. | H01L 21/76804 257/297 |
| 2010/0012980 | A1* | 1/2010 | Song et al. ..................... 257/208 | |
| 2013/0026467 | A1 | 1/2013 | Chuang et al. | |

FOREIGN PATENT DOCUMENTS

JP    2008-277434 A    11/2008

OTHER PUBLICATIONS

"Overlap Synonyms, Overlap Antonyms" pdf document.*

* cited by examiner

*Primary Examiner* — Kimberly Rizkallah
*Assistant Examiner* — Brian Turner
(74) *Attorney, Agent, or Firm* — Lee & Morse, P.C.

(57) ABSTRACT

Provided is a semiconductor device. The semiconductor device includes a semiconductor substrate having a contact region. An interlayer insulating layer is disposed on the semiconductor substrate. A lower contact plug passing through the interlayer insulating layer and electrically connected to the contact region is disposed. An interconnection structure is disposed on the interlayer insulating layer. An adjacent interconnection spaced apart from the interconnection structure is disposed on the interlayer insulating layer. A bottom surface of the interconnection structure includes a first part overlapping a part of an upper surface of the lower contact plug, and a second part overlapping the interlayer insulating layer.

16 Claims, 19 Drawing Sheets

SEMICONDUCTOR DEVICE

CROSS-REFERENCE TO RELATED APPLICATION

This application claims priority under 35 U.S.C. §119 to Korean Patent Application No. 10-2014-0015120, filed on Feb. 10, 2014, the disclosure of which is hereby incorporated by reference in its entirety.

BACKGROUND

Embodiments relate to a semiconductor device, a method of fabricating a semiconductor device, and an electronic system including the same.

As semiconductor devices are highly integrated, there is a problem in that electrical shorts occur between contact plugs and interconnection structures.

SUMMARY

Embodiments provide a semiconductor device which is capable of preventing an electrical short between a contact plug and a metal interconnection adjacent to the contact plug.

Other embodiments provide a semiconductor device including contact plugs and metal interconnections for increasing a degree of integration.

Still other embodiments provide a semiconductor device capable of increasing a degree of integration while suppressing electrical shorts between a contact plug and a metal interconnection adjacent to the contact plug.

Still other embodiments provide methods of fabricating the above-described semiconductor devices.

Still other embodiments provide an electronic apparatus and an electronic system having the above-described semiconductor devices.

In accordance with an aspect of embodiments, a semiconductor device is provided. The semiconductor device includes a semiconductor substrate having a contact region. An interlayer insulating layer is disposed on the semiconductor substrate. A lower contact plug passing through the interlayer insulating layer and electrically connected to the contact region is disposed. An interconnection structure is disposed on the interlayer insulating layer. An adjacent interconnection spaced apart from the interconnection structure is disposed on the interlayer insulating layer. A bottom surface of the interconnection structure includes a first part overlapping a part of an upper surface of the lower contact plug, and a second part overlapping the interlayer insulating layer.

In some embodiments, a buffer insulating layer disposed on the interlayer insulating layer may be further included. The interconnection structure may include a buffer plug part passing through the buffer insulating layer and electrically connected to the lower contact plug, and an interconnection part disposed on the buffer insulating layer and electrically connected to the buffer plug part. A bottom surface of the buffer plug part may overlap the part of the upper surface of the lower contact plug.

In other embodiments, a transistor including a source region, a drain region, a gate dielectric layer, and a gate electrode, and an insulating gate capping pattern disposed on the gate electrode, may be further included. The gate electrode may be disposed on an active region of the semiconductor substrate, the gate dielectric layer may be interposed between the active region and the gate electrode, and the source and drain regions may be disposed in the active region located at both sides of the gate electrode. One of the source and drain regions may be the contact region.

In still other embodiments, the buffer insulating layer may be interposed between the adjacent interconnection and the gate capping pattern.

In still other embodiments, the second part of the bottom surface of the interconnection structure may be further away from the adjacent interconnection than the first part of the bottom surface of the interconnection structure.

In still other embodiments, the interconnection structure may include a buffer plug part, a contact part disposed on the buffer plug part, and a line part laterally extending from contact part. The contact part may have a greater width than the line part, and the buffer plug part may have a greater width than the lower contact plug.

In still other embodiments, an upper contact plug disposed on the contact part and a metal interconnection disposed on the upper contact plug may be further included. The upper contact plug may be electrically connected to the contact part and have a greater width than the line part.

In still other embodiments, the upper surface of the lower contact plug may have a greater width at a part which overlaps the interconnection structure than at a part which does not overlap the interconnection structure.

In still other embodiments, the buffer plug part may have a greater width than the lower contact plug.

In accordance with another aspect of embodiments, a semiconductor device is provided. The semiconductor device includes a semiconductor substrate having a first contact region and a second contact region. A first contact plug is disposed on the first contact region of the semiconductor substrate. A second contact plug is disposed on the second contact region of the semiconductor substrate. A first interconnection structure is disposed on the first contact plug. The first interconnection structure includes a first buffer plug part and a first interconnection part disposed on the first buffer plug part. A second interconnection structure is disposed on the second contact plug. The second interconnection structure includes a second buffer plug part and a second interconnection part disposed on the second buffer plug part. An adjacent interconnection is disposed between the first and second interconnection parts. A distance between the first and second buffer plug parts is greater than a distance between the first and second contact plugs.

In some embodiments, a bottom surface of the first buffer plug part may include a first part overlapping a part of an upper surface of the first contact plug, and a second part spaced apart from the first contact plug. The second part of the bottom surface of the first buffer plug part may be further away from the adjacent interconnection than the first part of the bottom surface of the first buffer plug part.

In other embodiments, a bottom surface of the second buffer plug part may include a first part overlapping a part of an upper surface of the second contact plug, and a second part spaced apart from the second contact plug. The second part of the bottom surface of the second buffer plug part may be further away from the adjacent interconnection than the first part of the bottom surface of the second buffer plug part.

In still other embodiments, the first interconnection part may include a first contact part disposed on the first buffer plug part, and a first line part laterally extending from the first contact part and having a smaller width than the first contact part. The second interconnection part may include a second contact part disposed on the second buffer plug part, and a second line part laterally extending from the second contact part and having a smaller width than the second contact part.

In still other embodiments, a peripheral transistor disposed on the semiconductor substrate; a lower interlayer insulating layer disposed on the semiconductor substrate; and a buffer insulating layer disposed on the lower interlayer insulating layer may be further included. The peripheral transistor may include a peripheral gate electrode disposed on a peripheral active area of the semiconductor substrate, a peripheral gate dielectric disposed between the peripheral gate electrode and the peripheral active area, and a first peripheral impurity area and a second peripheral impurity area which are disposed in the peripheral active area located at both sides of the peripheral gate electrode. The lower interlayer insulating layer may be disposed on the first and second peripheral impurity areas located at the both sides of the peripheral gate electrode.

In still other embodiments, the first contact plug may pass through the lower interlayer insulating layer and be in contact with the first peripheral impurity area, and the second contact plug may pass through the lower interlayer insulating layer and be in contact with the second peripheral impurity area. The first contact region may be a part of the first peripheral impurity area in contact with the first contact plug, and the second contact region may be a part of the second peripheral impurity area in contact with the second contact plug. The first buffer plug part may pass through the buffer insulating layer and be in contact with a part of an upper surface of the first contact plug, and the second buffer plug part may pass through the buffer insulating layer and be in contact with a part of an upper surface of the second contact plug.

In still other embodiments, cell transistors disposed on the semiconductor substrate, bitline structures disposed on the semiconductor substrate, cell contact plugs disposed between the bitline structures, and cell conductive patterns disposed on the cell contact plugs may be further included. Each of the cell transistors may include a cell gate electrode buried in a gate trench which crosses a cell active area of the semiconductor substrate, a cell gate dielectric disposed between the cell gate electrode and the cell active area, and a first cell source/drain region and a second cell source/drain region which are disposed in the cell active area located at both sides of the cell gate electrode. The bitline structures may be electrically connected to the first cell source/drain regions. A part of each of the bitline structures may be disposed at substantially the same level as a part of the peripheral gate electrode. The cell contact plugs may be electrically connected to the second cell source/drain regions.

In still other embodiments, the cell conductive patterns may be formed of the same metal material as the first and second peripheral interconnection structures. Each of upper parts of the cell contact plugs may be formed of the same metal material as the first and second contact plugs. Each of lower parts of the cell contact plugs may be formed of a different material from the first and second contact plugs.

In accordance with still another aspect of embodiments, a semiconductor device is provided. The semiconductor device includes a first contact plug disposed on a first contact region of a semiconductor substrate. A first buffer plug part is disposed on the first contact plug. The first buffer plug part and the first contact plug are electrically in contact with and partially overlapped with each other. A first interconnection part is disposed on the first buffer plug part.

In some embodiments, the semiconductor device may further include an adjacent interconnection close to the first interconnection part. The first buffer plug part includes a first part overlapped with the first contact plug, and a second part not overlapped with the first contact plug. The first part may be closer to the adjacent interconnection than the second part.

In other embodiments, the semiconductor device may further comprise a second contact plug disposed on a second contact region of the semiconductor substrate, a second buffer plug part disposed on the second contact plug, and a second interconnection part disposed on the second buffer plug part. The second buffer plug part and the second contact plug are electrically in contact with and partially overlapped with each other. A distance between the first and second buffer plug parts may be greater than a distance between the first and second contact plugs. Also, a gate electrode may be further disposed between the first and second contact plugs.

Details of other embodiments are included in the detailed description and drawings.

BRIEF DESCRIPTION OF THE DRAWINGS

The foregoing and other features and advantages will be apparent from the more particular description of preferred embodiments, as illustrated in the accompanying drawings in which like reference numerals denote the same respective parts throughout the different views. The drawings are not necessarily to scale, emphasis instead being placed upon illustrating the principles of the embodiments. In the drawings:

FIG. 2C is a cross-sectional view showing an area taken along line III-III' of

FIG. 1B, an area taken along line IV-IV' of FIG. 1B, and an area taken along line V-V' of FIG. 1B;

DETAILED DESCRIPTION

Figure 1A:
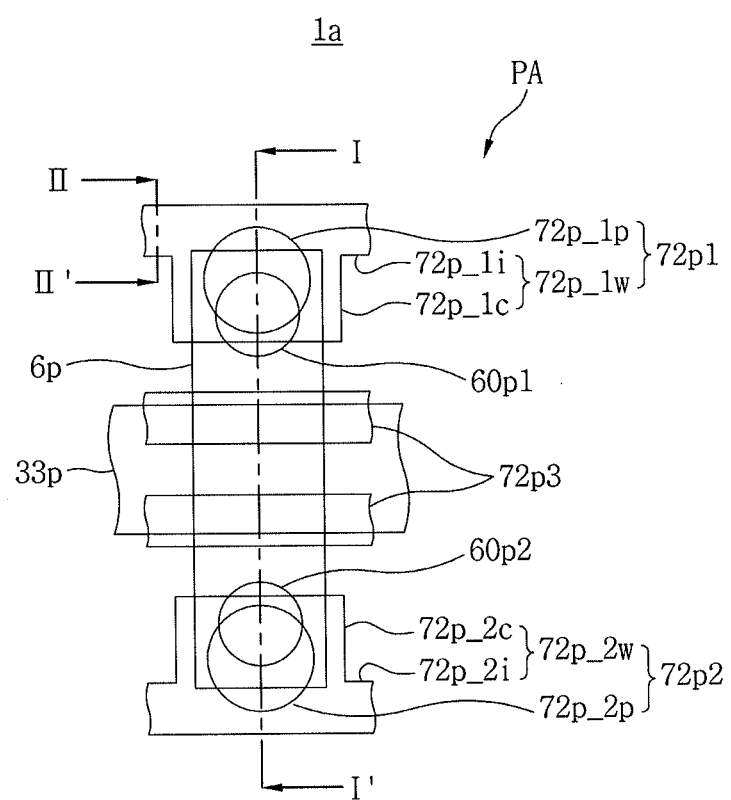
FIG. 1A is a plan view showing a peripheral region of a semiconductor device in accordance with an embodiment.

Advantages and features will be made apparent with reference to the accompanying drawings and some embodiments to be described below. Embodiments may, however, be embodied in various different forms, and should be construed as limited to those set forth herein. Rather, these embodiments are provided so that this disclosure is thorough and complete and fully conveys implementations to those skilled in the art. In the drawings, the sizes and relative sizes of layers and regions may be exaggerated for clarity. The same reference symbols denote the same components throughout the specification.

Embodiments are described herein with reference to cross-sectional views, plan views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. Therefore, regions illustrated in the drawings are schematic in nature, and their shapes are not intended to limit embodiments but only to illustrate characteristic forms of regions of devices.

The thicknesses of layers and regions in the drawings may be exaggerated for the sake of clarity. Further, it will be understood that when a layer is referred to as being "on" another layer or a substrate, the layer may be formed directly on the other layer or the substrate, or there may be an intervening layer therebetween.

Terms such as "top," "bottom," "upper," "lower," "above," "below," and the like are used herein to describe the relative positions of elements or features. It will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" a "top" without departing from the teachings of the embodiments.

Furthermore, throughout this disclosure, directional terms such as "upper," "intermediate," "lower," and the like may be used herein to describe the relationship of one element or feature with another, and the embodiments should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the embodiments.

The terminology used herein to describe embodiments is not intended to limit. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
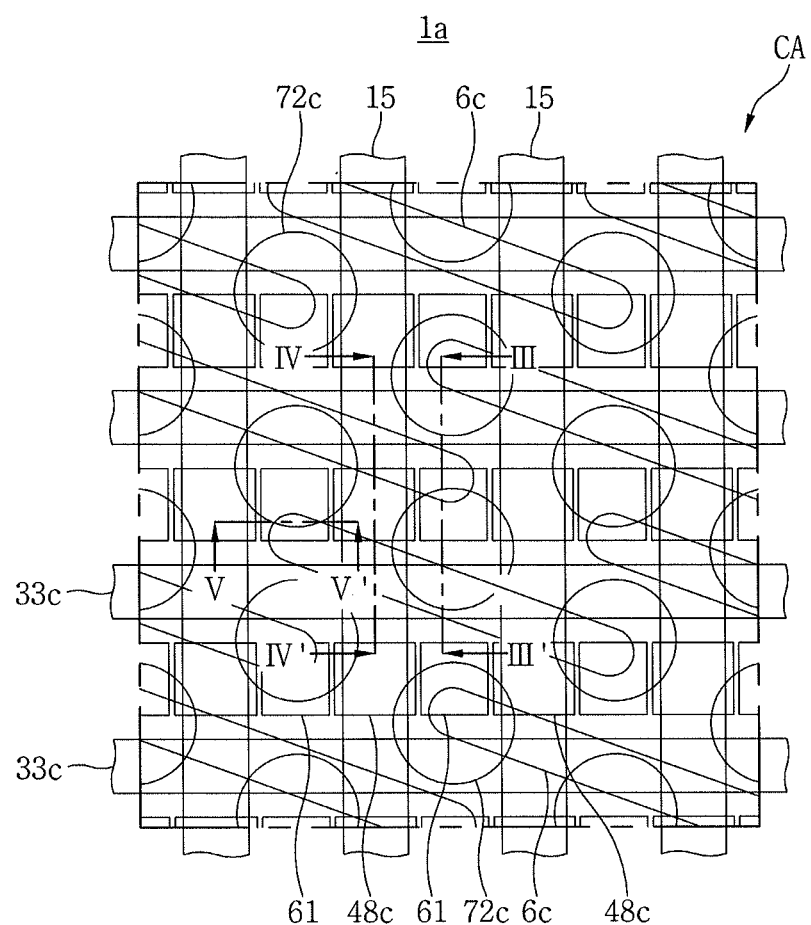
FIG. 1B is a plan view showing a cell region of a semiconductor device in accordance with an embodiment.
Figure 2A:
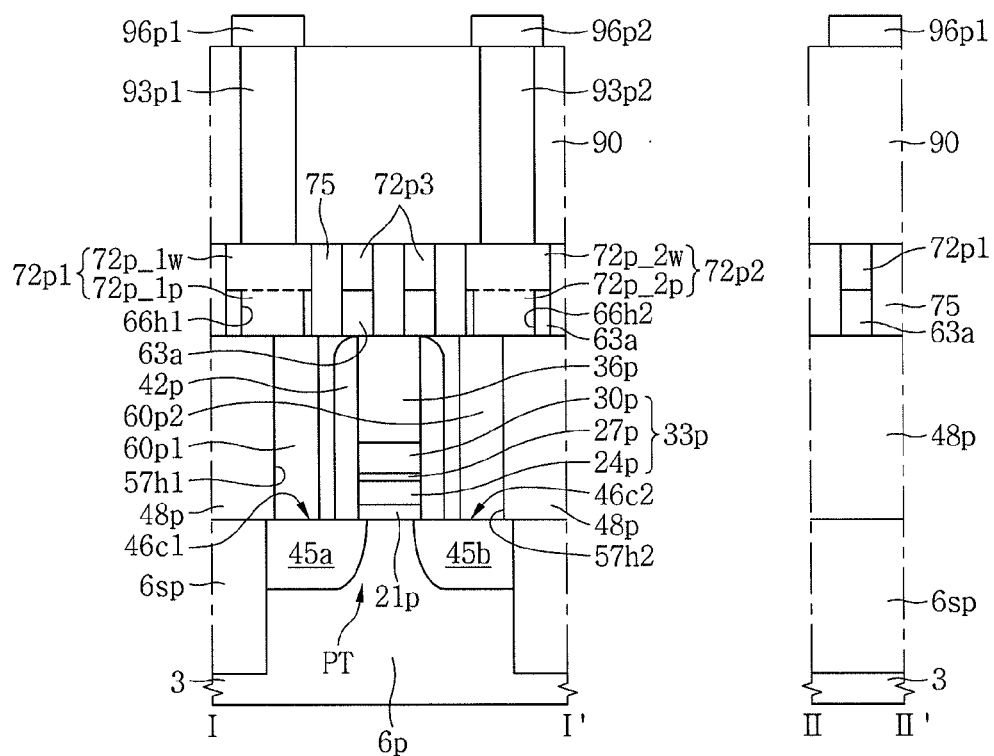
FIG. 2A is a cross-sectional view showing an area taken along line I-I' of FIG. 1A and an area taken along line II-II' of FIG. 1A.
Figure 2B:
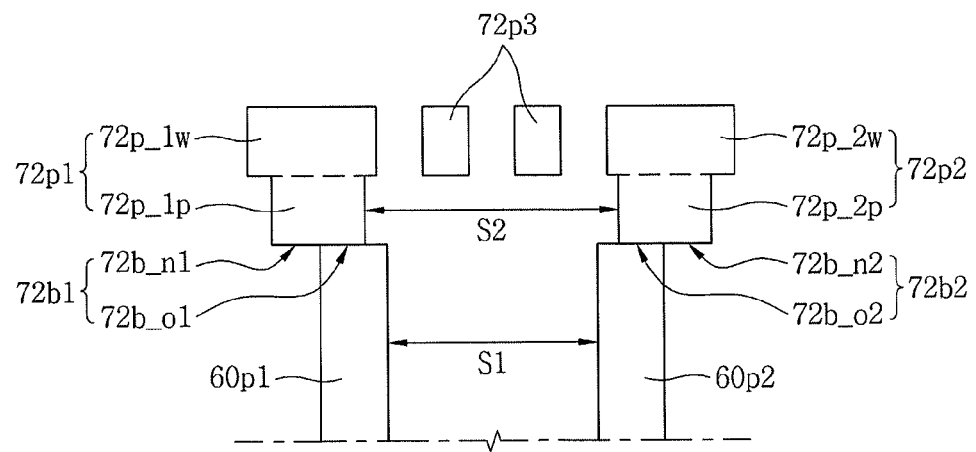
FIG. 2B is a schematic diagram for describing some components of FIG. 2A.
Figure 2C:
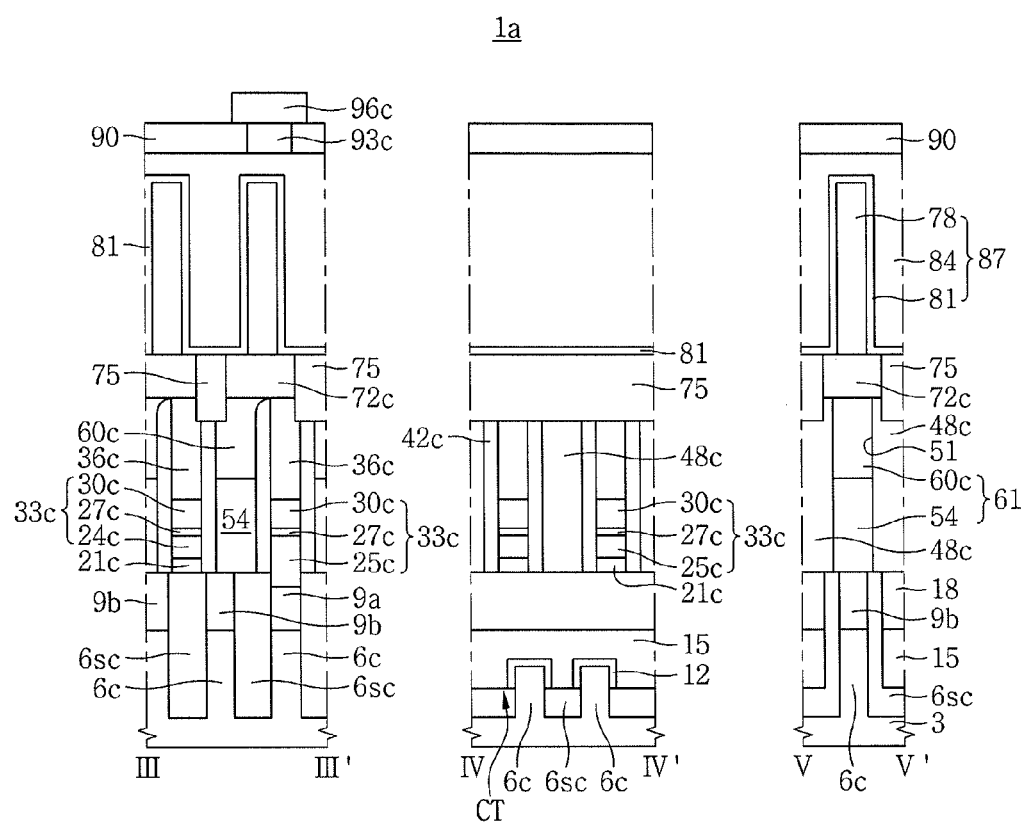

FIG. 1A is a plan view showing a peripheral region of a semiconductor device in accordance with an embodiment, and FIG. 1B is a plan view showing a cell region of a semiconductor device in accordance with an embodiment. FIG. 2A is a cross-sectional view showing an area taken along line I-I' of FIG. 1A and an area taken along line II-II' of FIG. 1A, FIG. 2B is a schematic diagram for describing some components of FIG. 2A, and FIG. 2C is a cross-sectional view showing an area taken along line III-III' of FIG. 1B, an area taken along line IV-IV' of FIG. 1B, and an area taken along line V-V' of FIG. 1B.

First, a semiconductor device in accordance with an embodiment will be described with reference to FIGS. 1A and 1B, and FIGS. 2A, 2B, and 2C.

Referring to FIGS. 1A and 1B, and FIGS. 2A, 2B, and 2C, a semiconductor device 1a in accordance with an embodiment may include a semiconductor substrate 3 having a cell region CA and a peripheral region PA, a peripheral transistor PT, a peripheral interlayer insulating layer 48p, first and second peripheral contact regions 46c1 and 46c2, first and second peripheral contact plugs 60p1 and 60p2, first and second peripheral interconnection structures 72p1 and 72p2, and an adjacent interconnection 72p3.

The semiconductor substrate 3 may be a semiconductor substrate formed of a semiconductor material such as a silicon. The cell region CA may refer to an area in which a plurality of cell transistors and/or a plurality of capacitor structures are regularly arranged, and the peripheral region PA may refer to an area including integrated circuits formed around the cell region CA.

The peripheral transistor PT, the peripheral interlayer insulating layer 48p, the first and second peripheral contact regions 46c1 and 46c2, and the first and second peripheral contact plugs 60p1 and 60p2, the first and second peripheral interconnection structures 72p1 and 72p2, and the adjacent interconnection 72p3 may be arranged in the peripheral region PA of the semiconductor substrate 3.

The peripheral transistor PT may include a first peripheral impurity area 45a, a second peripheral impurity area 45b, a peripheral gate dielectric 21p, and a peripheral gate electrode 33p. The peripheral gate electrode 33p may be arranged on a peripheral active area 6p of the semiconductor substrate 3 and extend onto a peripheral device isolation area 6sp. The peripheral device isolation area 6sp may be arranged in the peripheral region PA of the semiconductor substrate 3 and may define the peripheral active area 6p. The peripheral device isolation area 6sp may be formed as a shallow trench isolation layer.

The peripheral gate electrode 33p may include a sequentially stacked peripheral gate lower pattern 24p, peripheral gate intermediate pattern 27p, and peripheral gate upper pattern 30p. The peripheral gate lower pattern 24p may include a conductive material such as a polysilicon. The peripheral gate intermediate pattern 27p may include a conductive material, such as a metal silicide (e.g., WSi) and/or a metal nitride (e.g., TiN, TaN). The peripheral gate upper pattern 30p may include a metal material such as a tungsten. The peripheral gate dielectric 21p may be interposed between the peripheral gate electrode 33p and the peripheral active area 6p. The peripheral gate dielectric 21p may include a silicon oxide and/or a high-k dielectric.

The first and second peripheral impurity areas 45a and 45b may be disposed in the peripheral active area 6p positioned at both sides of the peripheral gate electrode 33p. One of the first and second peripheral impurity areas 45a and 45b may be a source region of the peripheral transistor PT, and the other one may be a drain region of the peripheral transistor PT.

The semiconductor device 1a may include a peripheral gate capping pattern 36p and a peripheral gate spacer 42p. The peripheral gate capping pattern 36p may be disposed on the peripheral gate electrode 33p. The peripheral gate capping pattern 36p may be formed of an insulating material such as a silicon nitride. The peripheral gate spacer 42p may be disposed on both sides of the sequentially stacked peripheral gate electrode 33p and peripheral gate capping pattern 36p. The peripheral gate spacer 42p may be formed of an insulating material such as a silicon oxide and/or a silicon nitride.

The peripheral interlayer insulating layer 48p may be disposed on the peripheral region PA of the semiconductor substrate 3 having the peripheral transistor PT, the peripheral gate capping pattern 36p, and the peripheral gate spacer 42p. The peripheral interlayer insulating layer 48p may be arranged to cover the peripheral device isolation area 6sp, and the first and second peripheral impurity areas 45a and 45b of the peripheral transistor PT, and expose an upper surface of the peripheral gate capping pattern 36p. The peripheral interlayer insulating layer 48p may be formed of an insulating material such as a silicon oxide.

The first peripheral contact region 46c1 may be defined by a first peripheral lower contact hole 57h1 which passes through the peripheral interlayer insulating layer 48p and exposes a predetermined area of the peripheral transistor PT. For example, the first peripheral contact region 46c 1 may be a part of the first peripheral impurity area 45a exposed by the first peripheral lower contact hole 57h1 passing through the peripheral interlayer insulating layer 48p.

The second peripheral contact region 46c2 may be defined by a second peripheral lower contact hole 57h2 which passes through the peripheral interlayer insulating layer 48p and exposes a predetermined area of the peripheral transistor PT. For example, the second peripheral contact region 46c2 may be a part of the second peripheral impurity area 45b exposed by the second peripheral lower contact hole 57h2 passing through the peripheral interlayer insulating layer 48p. The second peripheral contact region 46c2 may be spaced apart from the first peripheral contact region 46c1.

The first peripheral contact plug 60p1 may be disposed on the first peripheral contact region 46c1. The first peripheral contact plug 60p1 may pass through the peripheral interlayer insulating layer 48p and may be electrically connected to the first peripheral contact region 46c1. The first peripheral contact plug 60p1 may fill the first peripheral lower contact hole 57h1 and may be in contact with the first peripheral contact region 46c1. A part of the first peripheral impurity area 45a in contact with the first peripheral contact plug 60p1 may be defined as the first peripheral contact region 46c1.

The second peripheral contact plug 60p2 may be disposed on the second peripheral contact region 46c2. The second peripheral contact plug 60p2 may pass through the peripheral interlayer insulating layer 48p and may be electrically connected to the second peripheral contact region 46c2. The second peripheral contact plug 60p2 may fill the second peripheral lower contact hole 57h2 and may be in contact with the second peripheral contact region 46c2. A part of the second peripheral impurity area 45b in contact with the second peripheral contact plug 60p2 may be defined as the second peripheral contact region 46c2.

The first peripheral interconnection structure 72p1 may be disposed on the first peripheral contact plug 60p1. The second peripheral interconnection structure 72p2 may be disposed on the second peripheral contact plug 60p2. The adjacent interconnection 72p3 may be disposed between the first and second peripheral interconnection structures 72p1 and 72p2.

The first peripheral interconnection structure 72p1 may include a first buffer plug part 72p_1p and a first interconnection part 72p_1w. The first buffer plug part 72p_1p may be electrically connected to the first peripheral contact plug 60p1. The first buffer plug part 72p_1p may be in contact with the first peripheral contact plug 60p1. The first interconnection part 72p_1w may include a first contact part 72p_1c disposed on the first buffer plug part 72p_1p, and a first line part 72p_1i laterally extending from the first contact part 72p_1c.

The first buffer plug part 72p_1p may partly overlap the first peripheral contact plug 60p1. The first buffer plug part 72p_1p may overlap a part of an upper surface of the first peripheral contact plug 60p1. The first buffer plug part 72p_1p may be in contact with the part of the upper surface of the first peripheral contact plug 60p1. The first buffer plug part 72p_1p may include a bottom surface 72b1 which overlaps the part of the upper surface of the first peripheral contact plug 60p1, and overlaps the peripheral interlayer insulating layer 48p without overlapping the upper surface of the first peripheral contact plug 60p 1.

The bottom surface 72b1 of the first buffer plug part 72p_1p may include a first part 72b_o1 which overlaps the part of the upper surface of the first peripheral contact plug 60p1, and a second part 72b_n1 which does not overlap the upper surface of the first peripheral contact plug 60p1.

The first part 72b_o1 of the bottom surface 72b1 of the first buffer plug part 72p_1p may overlap and/or be in contact with the part of the upper surface of the first peripheral contact plug 60p1, and the second part 72b_n1 of the bottom surface 72b1 of the first buffer plug part 72p_1p may not overlap and be in contact with the upper surface of the first peripheral contact plug 60p1. The second part 72b_n1 of the bottom surface 72b1 of the first buffer plug part 72p_1p may be spaced apart from the first peripheral contact plug 60p1.

The second part 72b_n1 of the bottom surface 72b1 of the first buffer plug part 72p_1p may overlap and/or be in contact with an insulating material layer. The insulating material layer overlapping and/or in contact with the second part 72b_n1 of the bottom surface 72b1 of the first buffer plug part 72p_1p may include the peripheral interlayer insulating layer 48p. The second part 72b_n1 of the bottom surface 72b1 of the first buffer plug part 72p_1p may overlap and/or in contact with the peripheral interlayer insulating layer 48p.

In order to prevent electrical characteristics of a semiconductor device from being degraded due to resistance between the first peripheral contact plug 60p1 and the first buffer plug part 72p_1p, the upper surface of the first peripheral contact plug 60p1 may have a greater width at a part which overlaps the first buffer plug part 72p_1p than at a part which does not overlap the first buffer plug part 72p_1p.

The first contact part 72p_1c may be disposed on the first buffer plug part 72p_1p, and have a greater area than the first buffer plug part 72p_1p. The first line part 72p_1i may be disposed to horizontally extend from the first contact part 72p_1c, and have a smaller width than the first contact part 72p_1c.

The second peripheral interconnection structure 72p2 may include a second buffer plug part 72p_2p and a second interconnection part 72p_2w. The second buffer plug part 72p_2p may be electrically connected to the second peripheral contact plug 60p2. The second buffer plug part 72_2p may be in contact with the second peripheral contact plug 60p2. The second interconnection part 72p_2w may include a second contact part 72p_2c disposed on the second buffer plug part 72p_2p, and a second line part 72p_2i horizontally extending from the second contact part 72p_2c.

The second buffer plug part 72p_2p may overlap the second peripheral contact plug 60p2. The second buffer plug part 72p_2p may overlap a part of an upper surface of the second peripheral contact plug 60p2. The second buffer plug part 72p_2p may be in contact with the part of the upper surface of the second peripheral contact plug 60p2. The second buffer plug part 72p_2p may include a bottom surface 72b2 which overlaps the part of the upper surface of the second peripheral contact plug 60p2 and overlaps the peripheral interlayer insulating layer 48p without overlapping the upper surface of the second peripheral contact plug 60p2. The bottom surface 72b2 of the second buffer plug part 72_2p may include a first part 72b_o2 which overlaps the part of the upper surface of the second peripheral contact plug 60p2, and a second part 72b_n2 which does not overlap the upper surface of the second peripheral contact plug 60p2.

The first part 72b_o2 of the bottom surface 72b2 of the second buffer plug part 72p_2p may overlap and/or be in contact with the part of the upper surface of the second peripheral contact plug 60p2, and the second part 72b_n2 of the bottom surface 72b2 of the second buffer plug part 72p_2p may not overlap and be in contact with the upper surface of the second peripheral contact plug 60p2. The second part 72b_n2 of the bottom surface 72b2 of the second buffer plug part 72p_2p may be spaced apart from the second peripheral contact plug 60p2. The second part 72b_n2 of the bottom surface 72b2 of the second buffer plug part 72p_2p may overlap and/or be in contact with the peripheral interlayer insulating layer 48p.

The upper surface of the second peripheral contact plug 60p2 may have a greater width at a part which overlaps the second buffer plug part 72p_2p than at a part which does not overlap the second buffer plug part 72p_2p.

The second contact part 72p_2c may be disposed on the second buffer plug part 72p_2p, and have a greater area than the second buffer plug part 72p_2p. The second line part 72p_2i may be disposed to laterally extend from the second contact part 72p_2c, and have a smaller width than the second contact part 72p_2c. A distance between the first and second line parts 72p_1i and 72p_2i may be greater than a distance between the first and second contact parts 72p_1c and 72p_2c.

A distance S2 between the first and second buffer plug parts 72p_1p and 72p_2p may be greater than a distance S1 between the first and second peripheral contact plugs 60p1 and 60p2.

In the bottom surface 72b1 of the first buffer plug part 72p_1p, the second part 72b_n1 may be disposed to be more spaced apart from the second peripheral contact plug 60p2, the second peripheral interconnection structure 72p2, and/or the adjacent interconnection 72p3 than the first part 72b_o1.

In the bottom surface 72b2 of the second buffer plug part 72p_2p, the second part 72b_n2 may be disposed to be more spaced apart from the first peripheral contact plug 60p1, the first peripheral interconnection structure 72p1, and/or the adjacent interconnection 72p3 than the first part 72b_o2.

The adjacent interconnection 72p3 may be disposed between the first interconnection part 72p_1w of the first peripheral interconnection structure 72p1, and the second interconnection part 72p_2w of the second peripheral interconnection structure 72p2. The adjacent interconnection 72p3 may be disposed at substantially the same level as the first and second interconnection parts 72p_1w and 72p_2w, and at a higher level than the first and second buffer plug parts 72p_1p and 72p_2p.

The first and second peripheral interconnection structures 72p1 and 72p2, and the adjacent interconnection 72p3 may be formed of a conductive material. For example, the first and second peripheral interconnection structures 72p1 and 72p2, and the adjacent interconnection 72p3 may be formed of a metallic conductive material, such as a tungsten.

In some embodiments, since the distance S2 between the first and second buffer plug parts 72p_1p and 72p_2p is greater than the distance S1 between the first and second peripheral contact plugs 60p1 and 60p2, a distance between the first and second peripheral contact plugs 60p1 and 60p2 can be minimized, and electrical shorts between the first and second peripheral contact plugs 60p1 and 60p2 and the adjacent interconnection 72p3 can be prevented. By minimizing the distance between the first and second peripheral contact plugs 60p1 and 60p2, the degree of integration of the semiconductor devices can increase and the size of the semiconductor chips can decrease.

The semiconductor device 1a may include a peripheral buffer insulating layer 63a disposed under the first and second interconnection parts 72p_1w and 72p_2w, and the adjacent interconnection 72p3. The peripheral buffer insulating layer 63a may be disposed between the adjacent interconnection 72p3 and the peripheral interlayer insulating layer 48p, between the first interconnection part 72p_1w and the peripheral interlayer insulating layer 48p, and between the second interconnection part 72p_2w and the peripheral interlayer insulating layer 48p.

In addition, the peripheral buffer insulating layer 63a may be disposed to surround side surfaces of the first and second buffer plug parts 72p_1p and 72p_2p. In addition, on the peripheral gate capping pattern 36p, the peripheral buffer insulating layer 63a may be disposed between the adjacent interconnection 72p3 and the peripheral gate capping pattern 36p. The peripheral buffer insulating layer 63a may include side surfaces vertically aligned to sidewalls of the first and second interconnection parts 72p_1w and 72p_2w and the adjacent interconnection 72p3.

In addition, the semiconductor device 1a may include cell transistors CT and bitline structures 33c electrically connected to the cell transistors CT.

Each of the cell transistors CT may include a cell gate dielectric 12, a cell gate electrode 15, a first cell source/drain region 9a, and a second cell source/drain region 9b.

The cell gate electrode 15 may be buried in a gate trench crossing a cell active area 6c and extending to a cell device isolation area 6sc defining the cell active area 6c. The cell device isolation area 6sc may be a shallow trench isolation layer. The cell gate electrode 15 may be disposed at a lower level than an upper surface of the cell active area 6c. The cell gate electrode 15 may be disposed at a lower level than the peripheral gate electrode 33p. The cell gate dielectric 12 may be disposed between the cell gate electrode 15 and the cell active area 6c. The first and second cell source/drain regions 9a and 9b may be disposed in the cell active area 6c located at both sides of the cell gate electrode 15. A cell gate capping pattern 18 formed of an insulating material such as a silicon nitride may be disposed on the cell gate electrode 15.

Each of the bitline structures 33c may include a bitline lower pattern 24c, a bitline intermediate pattern 27c, a bitline upper pattern 30c, and a bitline contact pattern 25c.

The bitline contact pattern 25c may be electrically connected to the first cell source/drain region 9a. The bitline contact pattern 25c may overlap and/or be in contact with the first cell source/drain region 9a. The bitline lower pattern 24c may be disposed on the cell device isolation area 6sc and the cell gate capping pattern 18. The bitline intermediate pattern 27c may be disposed on the bitline lower pattern 24c and the bitline contact pattern 25c. The bitline upper pattern 30c may be disposed on the bitline intermediate pattern 27c.

The bitline structures 33c may be formed of conductive materials. The bitline contact pattern 25c may be formed of a conductive material such as a doped silicon. The bitline lower pattern 24c may be formed of the same material as the peripheral gate lower pattern 24p and have the same thickness. For example, the bitline lower pattern 24c and the peripheral gate lower pattern 24p may be formed of a conductive material such as a doped silicon. The bitline intermediate pattern 27c may be formed of the same material as the peripheral gate intermediate pattern 27p and have the same thickness. The bitline intermediate pattern 27c and the peripheral gate intermediate pattern 27p may be formed of a conductive material, such as a metal silicide and/or a metal nitride. The bitline upper pattern 30c may be formed of the same material as the peripheral gate upper pattern 30p and have the same thickness. The bitline upper pattern 30c and the peripheral gate upper pattern 30p may be formed of a metal material such as a tungsten.

The semiconductor device 1a may include a cell protection insulating layer 21c, a bitline capping pattern 36c, and bitline spacers 42c.

The cell protection insulating layer 21c may be disposed under the bitline lower pattern 24c. The cell protection insulating layer 21c may be formed of an insulating material, such as a silicon oxide and/or a silicon nitride. The cell protection insulating layer 21c may be interposed between the bitline lower pattern 24c and the cell device isolation area 6sc, and between the bitline lower pattern 24c and the cell gate capping pattern 18. The bitline capping pattern 36c may be disposed on the bitline structure 33c. The bitline capping pattern 36c may be formed of an insulating material such as a silicon nitride. The bitline spacers 42c may be disposed on side surfaces of the sequentially stacked bitline structure 33c and bitline capping pattern 36c. The bitline spacers 42c may be formed of an insulating material.

The semiconductor device 1a may include cell insulating isolation patterns 48c, cell contact plugs 61, and cell conductive patterns 72c.

The cell insulating isolation patterns 48c may be disposed in a space between the bitline structures 33c, and spaced apart from each other. The bitline spacers 42c may be interposed between the cell insulating isolation patterns 48c and the bitline structures 33c.

The cell contact plugs 61 may be disposed to fill a cell contact hole 51 disposed between the cell insulating isolation patterns 48c, and between the bitline structures 33c. Each of the cell contact plugs 61 may include sequentially stacked a cell lower contact plug 54 and a cell upper contact plug 60c.

The cell upper contact plug 60c may include the same material as the first and second peripheral contact plugs 60p1 and 60p2, and the cell lower contact plug 54 may include a different material from the first and second peripheral contact plugs 60p 1 and 60p2. For example, the cell lower contact plug 54 may be formed of a conductive material such as a doped silicon, and the first and second peripheral contact plugs 60p 1 and 60p2 and the cell upper contact plug 60c may be formed to include at least one of a metal silicide, a metal nitride, and a metal.

The cell conductive patterns 72c may be disposed to correspond one-to-one to the cell contact plugs 61. The cell conductive patterns 72c may be electrically connected to the cell contact plugs 61 in one-to-one correspondence. The cell conductive patterns 72c may be in contact with the cell contact plugs 61, respectively. The cell conductive patterns 72c may partially overlap the cell contact plugs 61. For example, bottom surfaces of the cell conductive patterns 72c may include parts overlapping the cell contact plugs 61, and parts overlapping the bitline capping pattern 36c.

The cell conductive patterns 72c may be formed of the same material as the first and second peripheral interconnection structures 72p1 and 72p2, and the adjacent interconnection 72p3. For example, the cell conductive patterns 72c, the first and second peripheral interconnection structures 72p1 and 72p2, and the adjacent interconnection 72p3 may be formed to include a conductive material such as a tungsten.

The semiconductor device 1a may include an insulating pattern 75 interposed between the cell conductive patterns 72c in the cell region CA, and interposed between the first interconnection part 72p_1w, the adjacent interconnection 72p3, and the second interconnection part 72p_2w in the peripheral region PA. In the peripheral region PA, the insulating pattern 75 may be interposed between the first and second interconnection parts 72p_1w and 72p_2w and the adjacent interconnection 72p3, and may be disposed to be interposed between the buffer insulating layers 63a or to pass through the buffer insulating layer 63a. In the cell region CA, the insulating pattern 75 may be interposed between the cell conductive patterns 72c and extend along a downward direction.

The semiconductor device 1a may include a capacitor structure 87 disposed in the cell region CA.

The capacitor structure 87 may include lower electrodes 78 electrically connected to and in contact with the cell conductive patterns 72c, upper electrodes 84 covering the lower electrodes 78, and a capacitor dielectric layer 81 between the upper electrodes 84 and the lower electrodes 78.

The semiconductor device 1a may include an upper interlayer insulating layer 90 disposed on the semiconductor substrate 3 having the capacitor structure 87, the first and second peripheral interconnection structures 72p1 and 72p2, and the adjacent interconnection 72p3. In the cell region CA of the semiconductor substrate 3, the upper interlayer insulating layer 90 may cover the capacitor structure 87. In the peripheral region PA of the semiconductor substrate 3, the upper interlayer insulating layer 90 may cover the first and second peripheral interconnection structures 72p1 and 72p2, and the adjacent interconnection 72p3.

The semiconductor device 1a may include first and second peripheral upper plugs 93p1 and 93p2 and first and second peripheral metal interconnections 96p1 and 96p2 disposed on the peripheral region PA.

The first peripheral upper plug 93p1 may be electrically connected to the first peripheral interconnection structure 72p1 passing through the upper interlayer insulating layer 90. The first peripheral upper plug 93p1 may be in contact with and/or overlap the first contact part 72p_1c of the first peripheral interconnection structure 72p1. The first peripheral upper plug 93p1 may have a greater width than the first line part 72p_1i of the first peripheral interconnection structure 72p1.

The second peripheral upper plug 93p2 may be electrically connected to the second peripheral interconnection structure 72p2 passing through the upper interlayer insulating layer 90.

The second peripheral upper plug 93p2 may be in contact with and/or overlap the second contact part 72p_2c of the second peripheral interconnection structure 72p2. The second peripheral upper plug 93p2 may have a greater width than the second line part 72p_2i of the second peripheral interconnection structure 72p2.

The first peripheral metal interconnection 96p1 may be disposed on the upper interlayer insulating layer 90, and electrically connected to the first peripheral upper plug 93p1. The second peripheral metal interconnection 96p2 may be disposed on the upper interlayer insulating layer 90, and electrically connected to the second peripheral upper plug 93p2.

The semiconductor device 1a may include a cell upper plug 93c and a cell metal interconnection 96c disposed in the cell region CA.

The cell upper plug 93c may pass through the upper interlayer insulating layer 90 in the cell region CA, and may be electrically connected to the upper electrodes 84. The cell metal interconnection 96c may be disposed on the upper interlayer insulating layer 90 of the cell region CA, and electrically connected to the cell upper plug 93c.

According to the embodiments, the semiconductor device 1a which shows an improved degree of integration, suppresses electrical shorts, and has excellent electrical properties can be provided in accordance with embodiments.

Figure 3A:
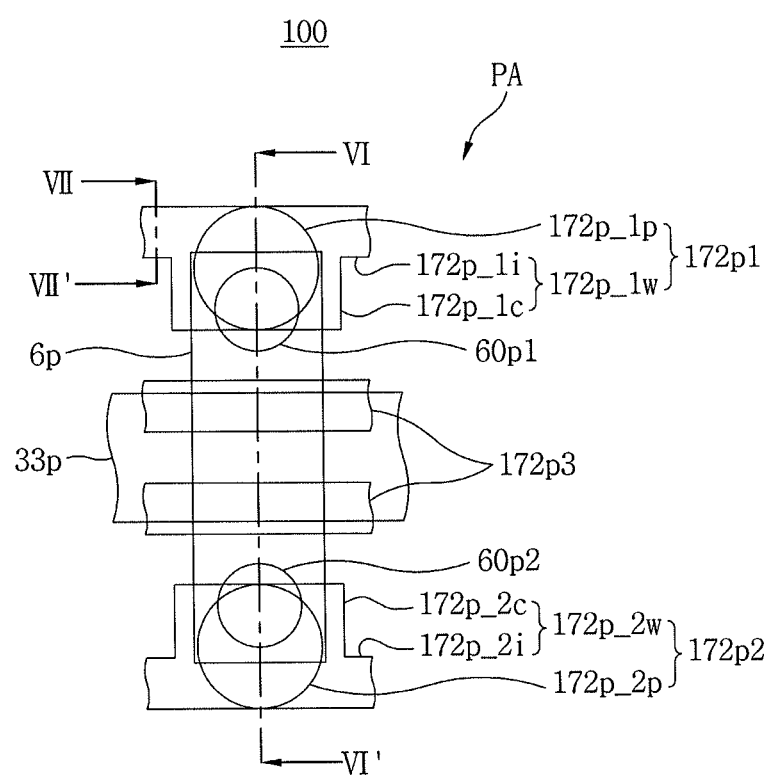
FIG. 3A is a plan view showing a peripheral region of a semiconductor device in accordance with another embodiment.
Figure 3B:
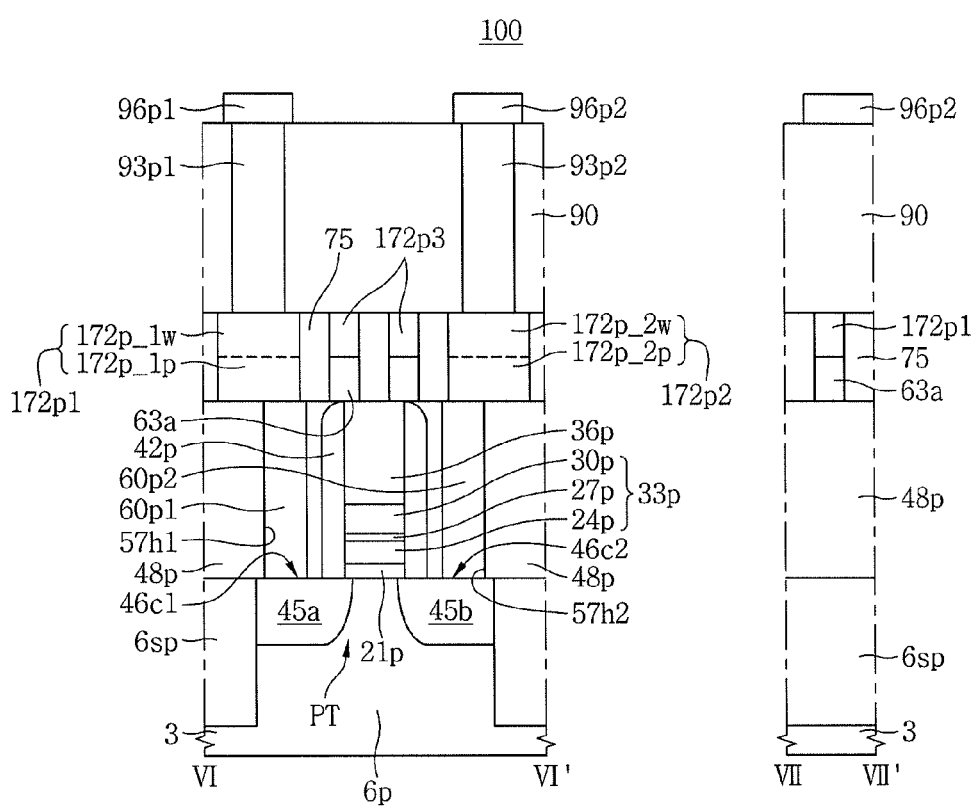
FIG. 3B is a cross-sectional view showing a peripheral region of a semiconductor device in accordance with another embodiment.

A semiconductor device in accordance with another embodiment will be described with reference to FIGS. 3A and 3B. FIG. 3A is a plan view showing a peripheral region of a semiconductor device 100 in accordance with the other embodiment, and FIG. 3B is a cross-sectional view showing a peripheral region of the semiconductor device 100 in accordance with the other embodiment. FIG. 3B is a cross-sectional view showing an area taken along line VI-VI' of FIG. 3A, and an area taken along line VII-VII' of FIG. 3A.

Referring to FIGS. 3A and 3B, the semiconductor device 100 in accordance with the other embodiment may include, as described with reference to FIGS. 1A, 1B, 2A, 2B, and 2C, the peripheral transistor PT, the first and second peripheral contact regions 46c1 and 46c2, the peripheral interlayer insulating layer 48p, and the first and second peripheral contact plugs 60p1 and 60p2 which are disposed in the peripheral region PA of the semiconductor substrate 3.

The semiconductor device 100 may include first and second peripheral interconnection structures 172p1 and 172p2, and one or more adjacent interconnections 172p3.

The first peripheral interconnection structure 172p1 may be disposed on the first peripheral contact plug 60p1. The first peripheral interconnection structure 172p1 may include a first buffer plug part 172p_1p and a first interconnection part 172p_1w. The first buffer plug part 172p_1p may be in contact with a part of an upper surface of the first peripheral contact plug 60p1. A bottom surface of the first buffer plug part 172p_1p may include, like the first buffer plug part 72p_1p described in FIG. 2C, a part overlapping and/or in contact with the part of the upper surface of the first peripheral contact plug 60p1, and a part overlapping and/or in contact with the peripheral interlayer insulating layer 48p. The first interconnection part 172p_1w may include a first contact part 172p_1c disposed on the first buffer plug part 172p_1p, and a first line part 172p_1i laterally extending from the first contact part 172p_1c.

When seen from the cross-section taken along line VI-VI' of FIG. 3A, the first contact part 172p_1c and the first buffer plug part 172p_1p may include vertically aligned side surfaces, and the first contact part 172p_1c and the first buffer plug part 172p_1p may have the same width.

The first contact part 172p_1c and the first buffer plug part 172p_1p may have a greater width than the first peripheral contact plug 60p1. Since the first buffer plug part 172p-1p is formed to have a greater width than the first peripheral contact plug 60p1, contact resistance between the first buffer plug part 172p_1p and the first peripheral contact plug 60p1 can be reduced.

The first line part 172p_1i may be arranged to laterally extend from the first contact part 172p_1c, and have a smaller width than the first contact part 172p_1c. The first line part 172p_1i may have a smaller width than the first buffer plug part 172p_1p.

The second peripheral interconnection structure 172p2 may be disposed on the second peripheral contact plug 60p2. The second peripheral interconnection structure 172p2 may include a second buffer plug part 172p_2p and a second interconnection part 172p_2w. The second buffer plug part 172p_2p may be in contact with and electrically connected to the second peripheral contact plug 60p2. A bottom surface of the second buffer plug part 172p_2p may include, like the second buffer plug part 72p_2p described in FIG. 2C, a part overlapping and/or in contact with a part of an upper surface of the second peripheral contact plug 60p2, and a part overlapping and/or in contact with the peripheral interlayer insulating layer 48p. The second interconnection part 172p_2w may include a second contact part 172p_2c disposed on the second buffer plug part 172p_2p, and a second line part 172p_2i horizontally extending from the second contact part 172p_2c.

Seen from the cross-section taken along line VI-VI' of FIG. 3A, the second contact part 172p_2c and the second buffer plug part 172p_2p may include vertically aligned side surfaces, and the second contact part 172p_2c and the second buffer plug part 172p_2p may have the same width.

The second contact part 172p_2c and the second buffer plug part 172p_2p may have a greater width than the second peripheral contact plug 60p2.

The second line part 172p_2i may be disposed to laterally extend from the second contact part 172p_2c, and have a smaller width than the second contact part 172p_2c. The second line part 172p_2i may have a smaller width than the second buffer plug part 172p_2p.

Since the first and second buffer plug parts 172p_1p and 172p_2p are formed to have a greater width than the first and second peripheral contact plugs 60p1 and 60p2, the first and second interconnection structures 172p1 and 172p2 including the first and second buffer plug parts 172p_1p and 172p_2p have improved electrical properties.

Accordingly, the semiconductor device 100 which shows an improved degree of integration, suppresses electrical shorts, and has excellent electrical properties can be provided in accordance with embodiments.

The adjacent interconnection 172p3 may be disposed between the first and second peripheral interconnection structures 172p1 and 172p2. The adjacent interconnection 172p3 may be disposed at substantially the same level as the first and second interconnection parts 172p_1w and 172p_2w.

The semiconductor device 100 may include a peripheral buffer insulating layer 63a.

The peripheral buffer insulating layer 63a may be, as described in FIGS. 2A and 2B, interposed between the adjacent interconnection 172p3 and the peripheral interlayer insulating layer 48p. In addition, the peripheral buffer insulating layer 63a may be disposed between parts of the first and second interconnection structures 172p1 and 172p2 and the peripheral interlayer insulating layer 48p. In addition, the peripheral buffer insulating layer 63a may be disposed between the adjacent interconnection 172p3 and the peripheral gate capping pattern 36p. The parts of the first and second interconnection structures 172p1 and 172p2 may have side surfaces vertically aligned with a side surface of the peripheral buffer insulating layer 63a. The adjacent interconnection 172p3 may have a side surface vertically aligned with the side surface of the peripheral buffer insulating layer 63a.

The semiconductor device 100 may include an insulating pattern 75. The insulating pattern 75 may be disposed on sidewalls of the first interconnection part 172p_1w, the adjacent interconnection 172p3, and the second interconnection part 172p_2w. The insulating pattern 75 may be interposed between the first interconnection part 172p_1w, the adjacent interconnection 172p3, and the second interconnection part 172p_2w. The insulating pattern 75 may be interposed between the first and second interconnection parts 172p_1w and 172p_2w, and the adjacent interconnection 172p3, and between the buffer insulating layers 63a.

Meanwhile, the semiconductor device 100 may include, as described in FIGS. 1A and 2B, the cell transistor CT, the bitline structures 33c, the cell contact plugs 61, and the cell conductive patterns 72c, which are disposed on the cell region CA.

In addition, the semiconductor device 100 may include, as described in FIGS. 2A and 2B, the capacitor structure 87, the upper interlayer insulating layer 90, the first and second peripheral upper plugs 93p1 and 93p2, the first and second peripheral metal interconnections 96p1 and 96p2, and the cell metal interconnection 96c.

Figure 4A:
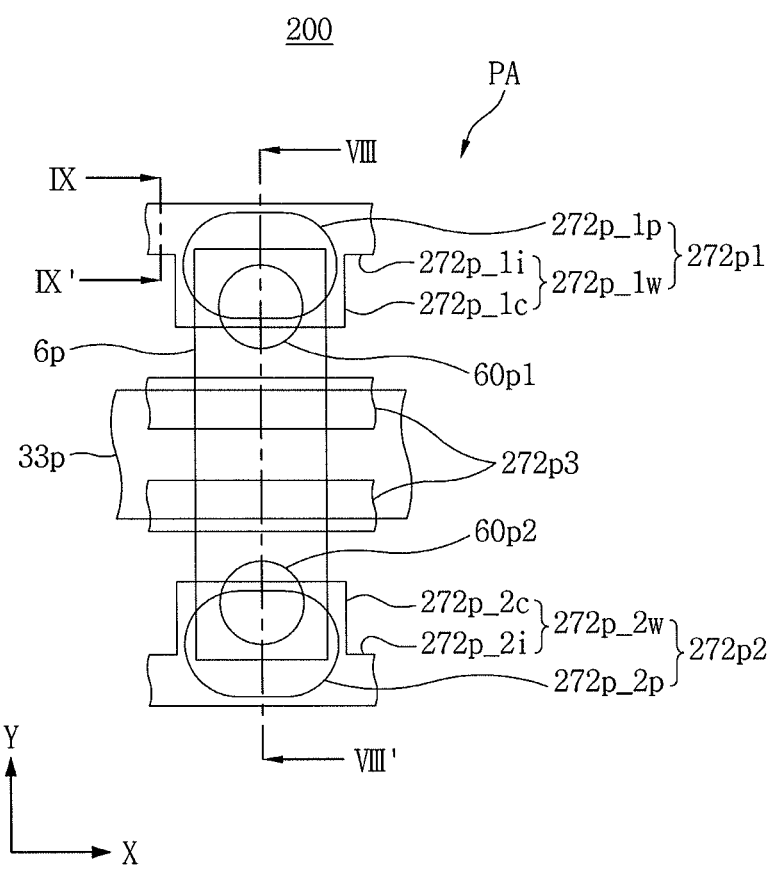
FIG. 4A is a plan view showing a peripheral region of a semiconductor device in accordance with still another embodiment.
Figure 4B:
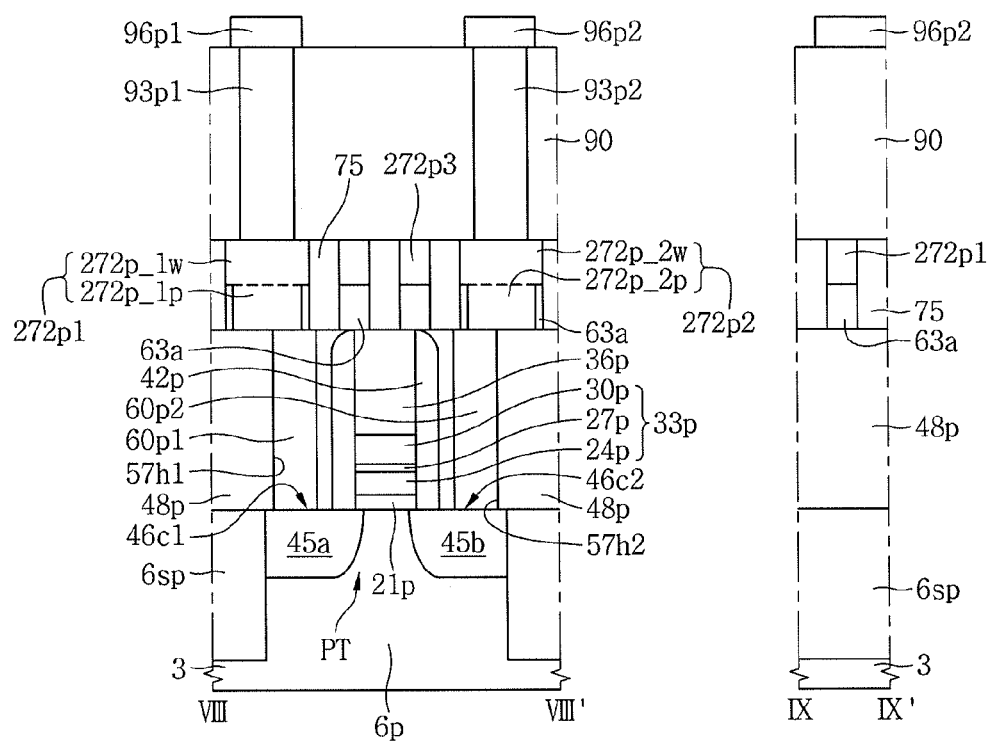
FIG. 4B is a cross-sectional view showing a peripheral region of a semiconductor device in accordance with still another embodiment.
Figure 5A:
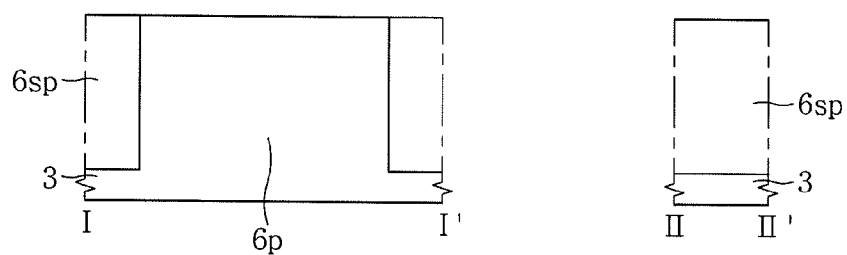
FIGS. 5A and 5B, FIGS. 6A and 6B, FIGS. 7A and 7B, FIGS. 8A and 8B.
Figure 5B:
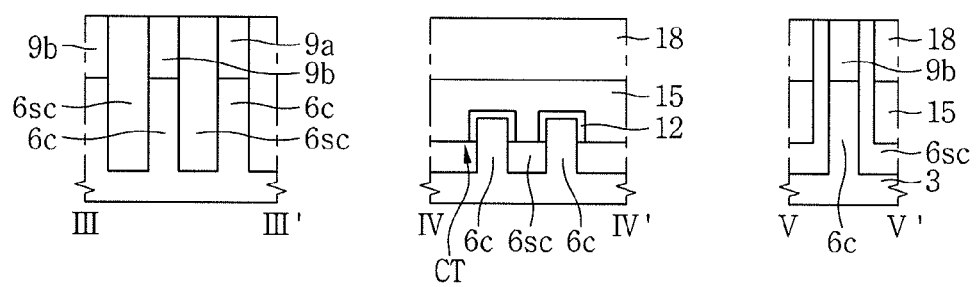
Figure 6A:
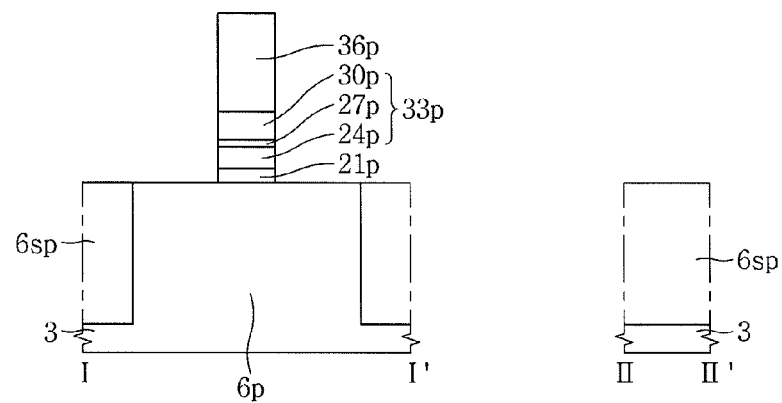
Figure 6B:
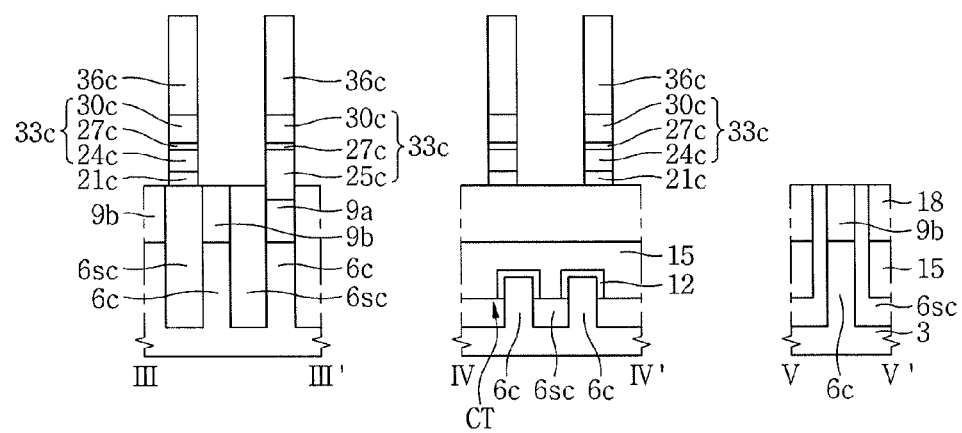
Figure 7A:
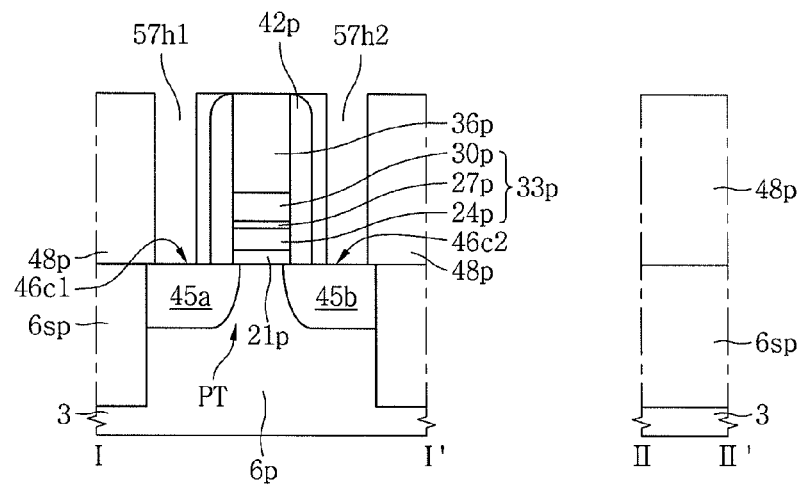
Figure 7B:
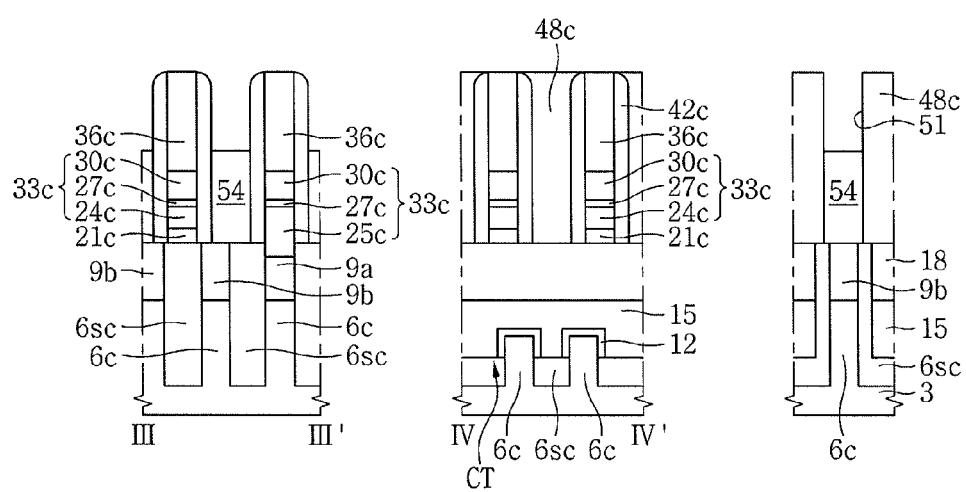
Figure 8A:
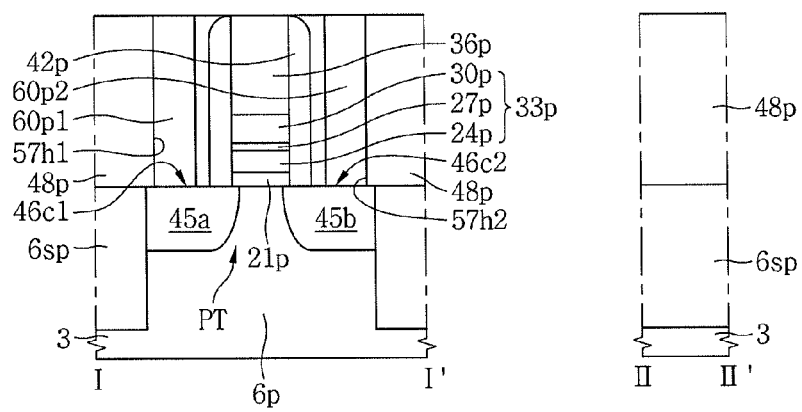
Figure 8B:
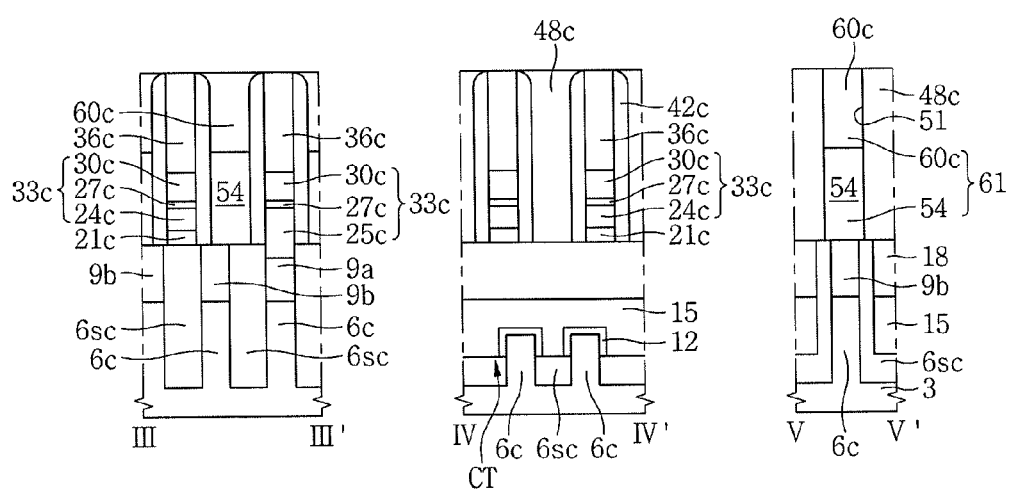
Figure 9A:
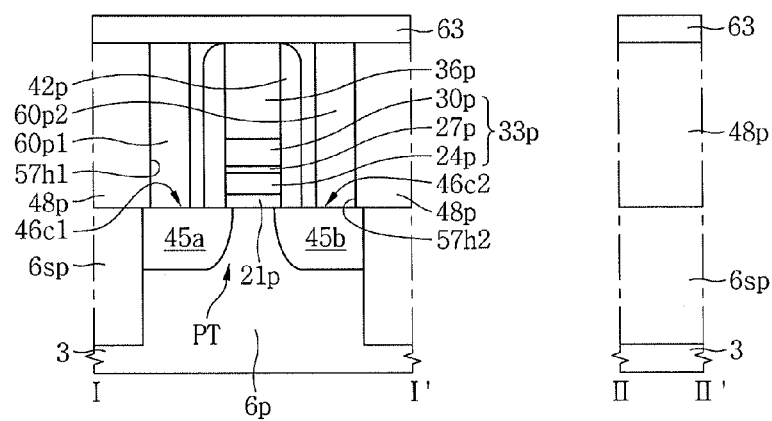
FIGS. 9A and 9B, FIGS. 10A and 10B, FIGS. 11A and 11B, and FIGS. 12A and 12B are cross-sectional views for describing stages in a method of fabricating a semiconductor device in accordance with embodiments.
Figure 9B:
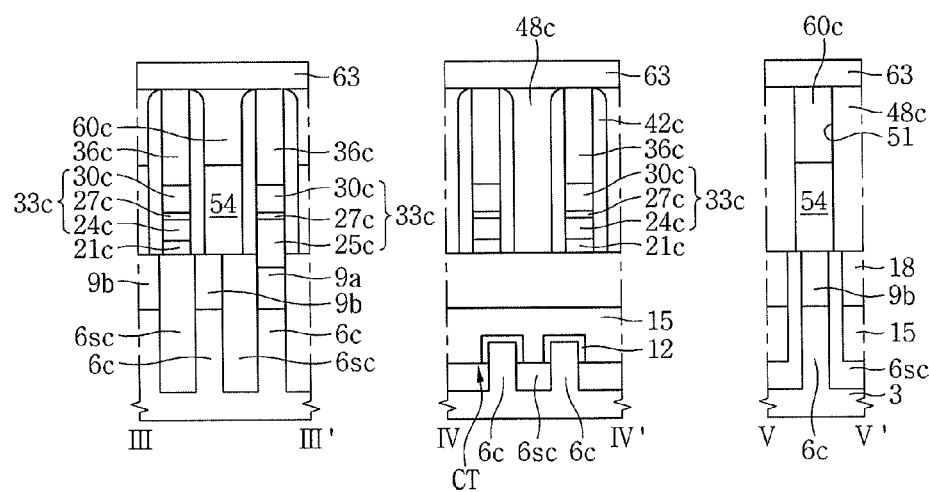
Figure 10A:
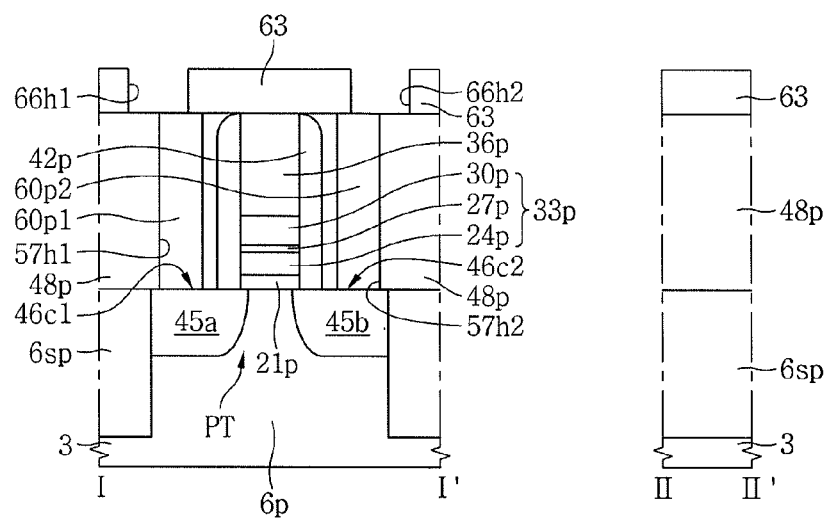
Figure 10B:
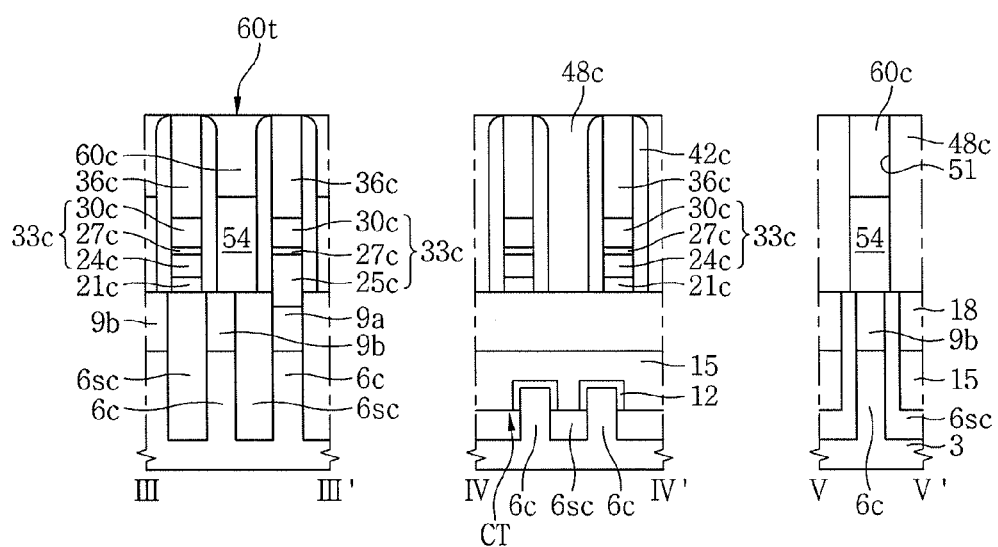
Figure 11A:
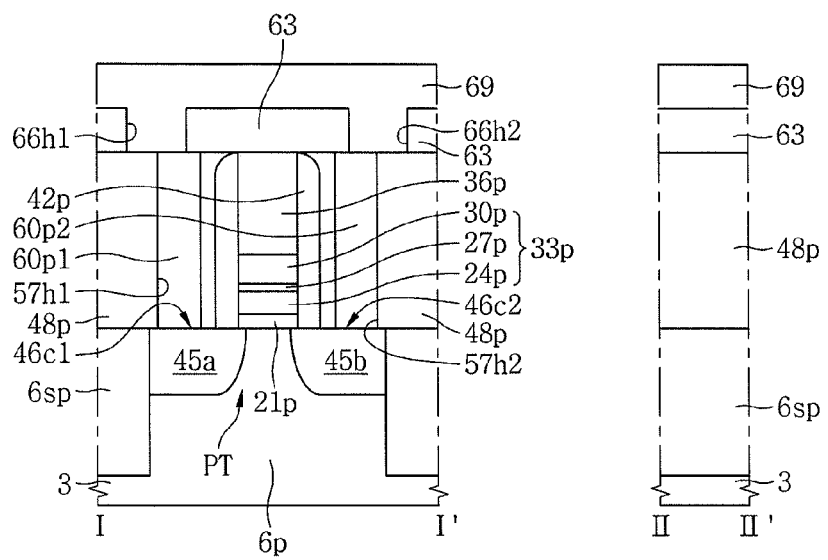
Figure 11B:
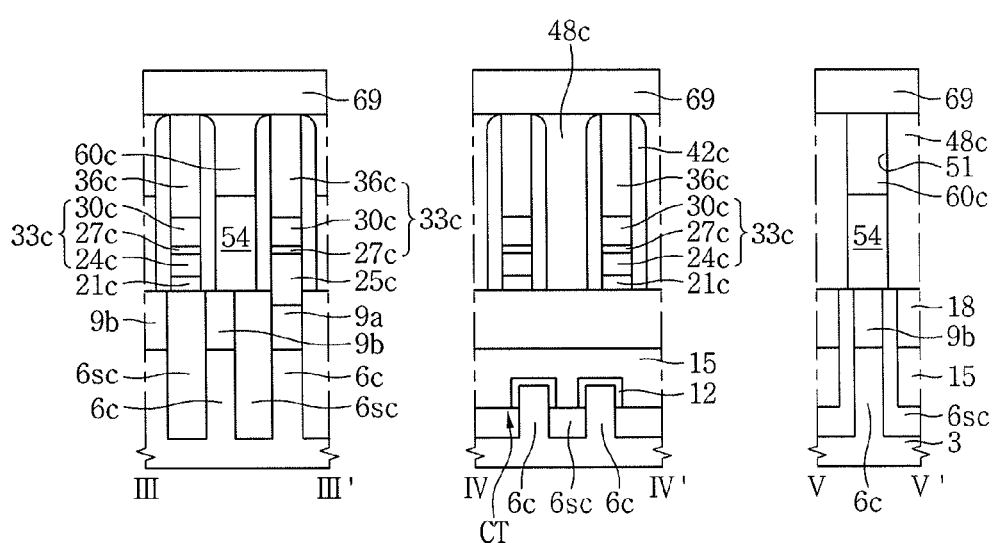
Figure 12A:
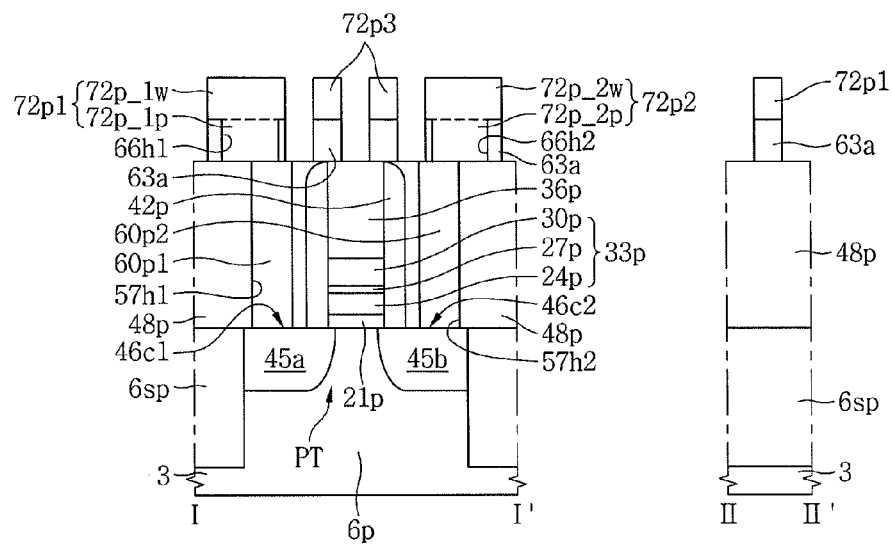
Figure 12B:
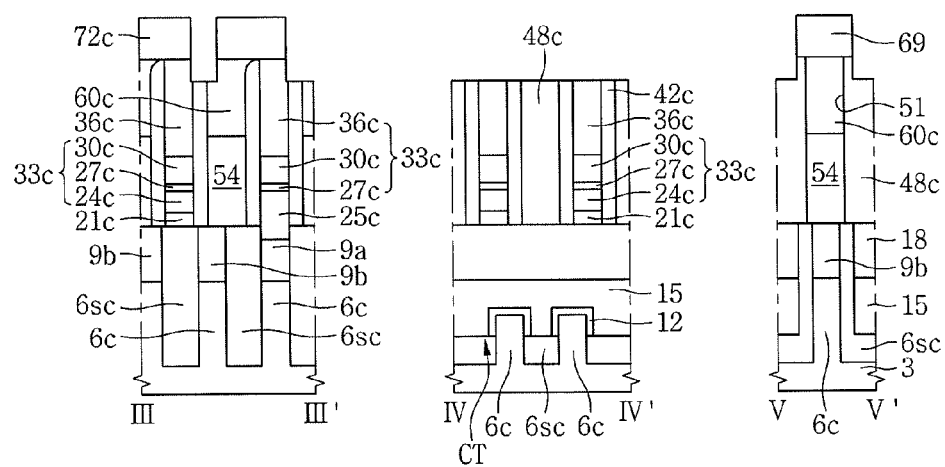

FIG. 4A is a plan view showing a peripheral region of a semiconductor device 200 in accordance with still another embodiment, and FIG. 4B is a cross-sectional view showing a peripheral region of the semiconductor device 200. FIG. 4B is a cross-sectional view showing an area taken along line VIII-VIII' of FIG. 4A, and an area taken along line IX-IX' of FIG. 4A.

Referring to FIGS. 4A and 4B, the semiconductor device 200 may include, as described with reference to FIGS. 1A, 1B, 2A, 2B, and 2C, the peripheral transistor PT, the first and second peripheral contact regions 46c 1 and 46c2, the peripheral interlayer insulating layer 48p, and the first and second peripheral contact plugs 60p1 and 60p2 which are disposed in the peripheral region PA of the semiconductor substrate 3.

The semiconductor device 200 may include first and second peripheral interconnection structures 272p1 and 272p2, and one or more adjacent interconnections 272p3.

The first peripheral interconnection structure 272p1 may be disposed on the first peripheral contact plug 60p 1. The first peripheral interconnection structure 272p1 may include a first buffer plug part 272p_1p and a first interconnection part 272p_1w. The first buffer plug part 272p_1p may be in contact with a part of an upper surface of the first peripheral contact plug 60p1.

A bottom surface of the first buffer plug part 272p_1p may include, like the first buffer plug part 72p_1p described in FIG. 2C, a part overlapping and/or in contact with the part of the upper surface of the first peripheral contact plug 60p1, and a part overlapping and/or in contact with the peripheral interlayer insulating layer 48p. The first buffer plug part 272p_1p may have a bar shape so as to increase a contact region with the first peripheral contact plug 60p1. For example, the first buffer plug part 272p_1p, in a plan view, may have a greater width in a first direction X than in a second direction Y.

The first direction X and the second direction Y may be perpendicular to each other. In addition, the width of the first buffer plug part 272p_1p in the first direction X may be greater than a width of the first peripheral contact plug 60p1.

Accordingly, contact resistance between the first buffer plug part 272p_1p and the first peripheral contact plug 60p 1 may decrease due to a structure and shape of the first buffer plug part 272p_1p.

The first interconnection part 272p_1w may include a first contact part 272p_1c disposed on the first buffer plug part 272p_1p, and a first line part 272p_1i laterally extending from the first contact part 272p_1c. The first line part 272p_1i may extend in the first direction X from the first contact part 272p1c.

The first line part 272p_1i may have a smaller width than the first contact part 272p_1c. The first line part 272p_1i may have a smaller width than the first buffer plug part 272p_1p.

The second peripheral interconnection structure 272p2 may be disposed on the second peripheral contact plug 60p2. The second peripheral interconnection structure 272p2 may include a second buffer plug part 272p_2p and a second interconnection part 272p_2w. The second buffer plug part 272p_2p may be in contact with and electrically connected to the second peripheral contact plug 60p2.

A bottom surface of the second buffer plug part 272p_2p may include, like the second buffer plug part 72p_2p described in FIG. 2C, a part overlapping and/or in contact with a part of an upper surface of the second peripheral contact plug 60p2, and a part overlapping and/or in contact with the peripheral interlayer insulating layer 48p.

The second buffer plug part 272p_2p may have the same plan view as the first buffer plug part 272p_1p.

For example, the second buffer plug part 272p_2p may have a bar shape so as to increase a contact region with the second peripheral contact plug 60p2. The second buffer plug part 272p_2p, in a plan view, may have a greater width in the first direction X than in the second direction Y.

The width of the second buffer plug part 272p_2p in the first direction X may be greater than a width of the second peripheral contact plug 60p2.

The second interconnection part 272p_2w may include a second contact part 272p_2c disposed on the second buffer plug part 272p_2p, and a second line part 272p_2i laterally extending from the second contact part 272p_2c.

The second line part 272p_2i may be disposed to extend from the second contact part 272p_2c in the first direction X, and may have a smaller width than the second contact part 272p_2c and/or the second buffer plug part 272p_2p.

Since the first and second buffer plug parts 272p_1p and 272p_2p are formed to have a greater width than the first and second peripheral contact plugs 60p1 and 60p2, the first and second peripheral interconnection structures 272p1 and 272p2 including the first and second buffer plug parts 272p_1p and 272p_2p have improved electrical properties.

The adjacent interconnection 272p3 may be disposed between the first and second peripheral interconnection structures 272p1 and 272p2. The adjacent interconnection 272p3 may be disposed at substantially the same level as the first and second interconnection parts 272p_1w and 272p_2w.

The semiconductor device 200 may include a peripheral buffer insulating layer 63a. The peripheral buffer insulating layer 63a may be, as described in FIGS. 2A and 2B, interposed between the adjacent interconnection 272p3 and the peripheral interlayer insulating layer 48p. The peripheral buffer insulating layer 63a may be disposed between parts of the first and second peripheral interconnection structures 272p1 and 272p2, and the peripheral interlayer insulating layer 48p. In addition, the peripheral buffer insulating layer 63a may be disposed between the adjacent interconnection 272p3 and the peripheral gate capping pattern 36p.

The semiconductor device 200 may include an insulating pattern 75. The insulating pattern 75 may be disposed on sidewalls of the first interconnection part 272p_1w, the adjacent interconnection 272p3, and the second interconnection part 272p_2w. The insulating pattern 75 may be interposed between the first interconnection part 272p_1w, the adjacent interconnection 272p3, and the second interconnection part 272p_2w. The insulating pattern 75 may be interposed between the first and second interconnection parts 272p_1w and 272p_2w, and the adjacent interconnection 272p3, and between the patterned buffer insulating layers 63a.

Meanwhile, the semiconductor device 200 may include, as described in FIGS. 1A and 2B, the cell transistor CT, the bitline structures 33c, the cell contact plugs 61, and the cell conductive patterns 72c, which are disposed in the cell region CA.

In addition, the semiconductor device 200 may include, as described in FIGS. 2A and 2B, the capacitor structure 87, the upper interlayer insulating layer 90, the first and second peripheral upper plugs 93p1 and 93p2, the first and second peripheral metal interconnections 96p1 and 96p2, and the cell metal interconnection 96c.

Next, methods of fabricating semiconductor devices in accordance with embodiments will be described with reference to FIGS. 5A and 5B, FIGS. 6A and 6B, FIGS. 7A and 7B, FIGS. 8A and 8B, FIGS. 9A and 9B, FIGS. 10A and 10B, FIGS. 11A and 11B, and FIGS. 12A and 12B. FIGS. 5A, 6A, 7A, 8A, 9A, 10A, 11A, and 12A are cross-sectional views taken along line I-I' of FIG. 1A, and line II-II' of FIG. 1A, and FIGS. 5B, 6B, 7B, 8B, 9B, 10B, 11B, and 12B are cross-sectional views taken along line III-III' of FIG. 1B, line IV-IV' of FIG. 1B, and along line V-V' of FIG. 1B.

First, referring to FIGS. 1A and 1B and FIGS. 5A and 5B, a semiconductor substrate 3 having a cell region CA and a peripheral region PA may be prepared. The substrate 3 may be a semiconductor substrate formed of a semiconductor material such as a silicon. A cell device isolation area 6sc which defines a cell active area 6c in the cell region CA of the substrate 3, and a peripheral device isolation area 6sp which defines a peripheral active area 6p in the peripheral region PA of the substrate 3, may be formed.

The formation of the cell and peripheral device isolation areas 6sc and 6sp may include forming a field trench defining the cell active area 6c and the peripheral active area 6p in the semiconductor substrate 3, and forming an insulating material layer filling the field trench. The insulating material layer may include an insulating material, such as a silicon oxide, a silicon oxynitride, or a silicon nitride.

Cell transistors CT may be formed in the cell region CA of the substrate 3. Each of the cell transistors CT may include a cell gate structure crossing the cell active area 6c and buried in a gate trench extending into the cell device isolation area 6sc, and first and second cell source/drain regions 9a and 9b formed in the cell active area 6c disposed at both sides of the cell gate structure. The cell gate structures may be parallel each other.

The formation of the first cell source/drain region 9a and the second cell source/drain region 9b may include injecting impurity ions in the cell active area 6c using an ion injection process, before forming the gate trench or after forming the cell gate structure.

The formation of the cell gate structure may include forming the gate trench crossing the cell active area 6c and extending into the cell device isolation area 6sc, forming a cell gate dielectric 12 on a exposed part of the cell active area 6c which is exposed by the gate trench, and forming a cell gate electrode 15 partially filling the gate trench on the cell gate dielectric 12. A cell gate capping pattern 18 filling a remaining part of the gate trench may be formed on the cell gate electrode 15.

The cell gate electrode 15 may be formed of a conductive material, such as polysilicon, titanium nitride, titanium, tungsten nitride, or tungsten. The cell gate capping pattern 18 may be formed of an insulating material such as a silicon nitride. The cell gate electrode 15 may be a wordline of a memory device such as a DRAM. The cell gate electrode 15 may be formed at a lower level than an upper surface of the cell active area 6c.

Referring to FIGS. 1A and 1B and FIGS. 6A and 6B, bitline structures 33c may be formed in the cell region CA of the semiconductor substrate 3, and a peripheral gate electrode 33p may be formed in the peripheral region PA of the semiconductor substrate 3. For example, the formation of the bitline structures 33c and the peripheral gate electrode 33p may include forming a cell protection insulating layer 21c on the cell region CA of the semiconductor substrate 3, and a peripheral gate dielectric 21p on the peripheral active area 6p of the peripheral region PA of the semiconductor substrate 3, forming a lower conductive layer, forming a bitline contact hole passing through the lower conductive layer and the cell protection insulating layer 21c and exposing the first cell source/drain region 9a in the cell region CA of the substrate 3, forming a bitline contact pattern 25c in the bitline contact hole, forming an intermediate conductive layer on the lower conductive layer and the bitline contact pattern 25c, forming an upper conductive layer on the intermediate conductive layer, forming a bitline capping pattern 36c on the upper conductive layer of the cell region CA and a peripheral gate capping pattern 36p on the upper conductive layer of the peripheral region PA, and sequentially etching the upper conductive layer, the intermediate conductive layer, and the lower conductive layer using the bitline capping pattern 36c and the peripheral gate capping pattern 36p as an etch mask.

The peripheral gate dielectric 21p may be formed before/after forming the cell protection insulating layer 21c, or at the same time as the cell protection insulating layer 21c. For example, the cell protection insulating layer 21c may be formed of silicon oxide and/or silicon nitride using a deposition process, and the peripheral gate dielectric 21p may be formed by forming silicon oxide on an upper surface of the peripheral active area 6p using a thermal oxidation process after performing a process of exposing the upper surface of the peripheral active area 6p.

The lower conductive layer may be etched to be a bitline lower pattern 24c in the cell region CA and a peripheral gate lower pattern 24p in the peripheral region PA. The lower conductive layer may be formed of a conductive material such as a doped polysilicon.

The intermediate conductive layer may be etched to be a bitline intermediate pattern 27c in the cell region CA and a peripheral gate intermediate pattern 2'7p in the peripheral region PA. The intermediate conductive layer may be formed of a conductive material, such as a metal silicide and/or a metal nitride.

The upper conductive layer may be etched to be a bitline upper pattern 30c in the cell region CA and a peripheral gate upper pattern 30p in the peripheral region PA.

The upper conductive layer may be formed of a conductive material such as a tungsten. The bitline contact pattern 25c may be formed of a doped polysilicon, etc.

The bitline lower pattern 24c, the bitline contact pattern 25c, the bitline intermediate pattern 27c, and the bitline upper pattern 30c may configure the bitline structure 33c.

The peripheral gate lower pattern 24p, the peripheral gate intermediate pattern 27p, and the peripheral gate upper pattern 30p which are sequentially stacked on the peripheral region PA of the substrate 3 may configure the peripheral gate electrode 33p.

Referring to FIGS. 1A and 1B and FIGS. 7A and 7B, insulating bitline spacers 42c may be formed on sidewalls of the sequentially stacked bitline structures 33c and bitline capping patterns 36c. Insulating peripheral gate spacers 42p may be formed on sidewalls of the sequentially stacked peripheral gate electrode 33p and the peripheral gate capping pattern 36p.

A first peripheral impurity area 45a and a second peripheral impurity area 45b may be formed in the peripheral active area 6p located at both sides of the peripheral gate electrode 33p by performing an ion injection process.

The peripheral gate dielectric 21p, the peripheral gate electrode 33p, the first peripheral impurity area 45a, and the second peripheral impurity area 45b may configure a peripheral transistor PT. One of the first and second peripheral impurity areas 45a and 45b may be a source region of the peripheral transistor PT, and the other one may be a drain region of the peripheral transistor PT.

A peripheral interlayer insulating layer 48p may be formed on the peripheral region PA of the semiconductor substrate 3 including the peripheral transistor PT. Cell insulating isolation patterns 48c may be formed on the cell region CA of the semiconductor substrate 3 including the bitline structures 33c. The cell insulating isolation patterns 48c may be formed between the bitline structures 33c.

A cell lower contact plug 54 may be formed between the bitline structures 33c and the cell insulating isolation patterns 48c.

A first peripheral lower contact hole 57h1 exposing a first contact region of the first peripheral impurity area 45a, and a second peripheral lower contact hole 57h2 exposing a second contact region of the second peripheral impurity area 45b may be formed by patterning the peripheral interlayer insulating layer 48p.

The cell lower contact plug 54 may be partially etched while forming the first and second peripheral lower contact holes 57h1 and 57h2 or after forming the first and second peripheral lower contact holes 57h1 and 57h2. Accordingly, the cell lower contact plug 54 may be located at a lower level than an upper surface of the bitline capping pattern 36c.

Referring to FIGS. 1A and 1B and FIGS. 8A and 8B, a conductive layer may be formed on the substrate including the first and second peripheral lower contact holes 57h1 and 57h2, and the conductive layer may be planarized. Accordingly, a first peripheral contact plug 60p1 may be formed in the first peripheral lower contact hole 57h1, and a second peripheral contact plug 60p2 may be formed in the second peripheral lower contact hole 57h2. In addition, a cell upper contact plug 60c may be formed on the cell lower contact plug 54. The sequentially stacked cell lower contact plug 54 and the cell upper contact plug 60c may configure a cell contact plug 61.

Referring to FIGS. 1A and 1B and FIGS. 9A and 9B, a buffer insulating layer 63 may be formed on the substrate including the first and second peripheral contact plugs 60p1 and 60p2 and the cell contact plug 61. The buffer insulating layer 63 may be formed of an insulating material, such as a silicon oxide and/or a silicon nitride.

Referring to FIGS. 1A and 1B and FIGS. 10A and 10B, a first peripheral buffer contact hole 66h1 partially exposing an upper surface of the first peripheral contact plug 60p1 on the peripheral region PA of the semiconductor substrate 3, and a second peripheral buffer contact hole 66h2 partially exposing an upper surface of the second peripheral contact plug 60p2 may be formed by patterning the buffer insulating layer 63.

The first peripheral buffer contact hole 66h1 may expose a part of the upper surface of the first peripheral contact plug 60p1 and a part of an upper surface of the peripheral interlayer insulating layer 48p, and the second peripheral buffer contact hole 66h2 may expose a part of the upper surface of the second peripheral contact plug 60p2 and a part of the upper surface of the peripheral interlayer insulating layer 48p.

In addition, while the first and second peripheral buffer contact holes 66h1 and 66h2 are formed, the buffer insulating layer 63 located on the cell region CA of the semiconductor substrate 3 may be etched and removed to expose upper surfaces 60t of the cell upper contact plugs 60c.

In some embodiments, the first and second peripheral buffer contact holes 66h1 and 66h2 may have the same size as the first and second buffer plug parts 72p_1p and 72p_2p in FIG. 1A. However, embodiments are not limited thereto. For example, the first and second peripheral buffer contact holes 66h1 and 66h2 may be formed to have the same size as the first and second buffer plug parts 172p_1p and 172p_2p in FIG. 3A or the first and second buffer plug parts 272p_1p and 272p_2p in FIG. 4A.

Referring to FIGS. 1A and 1B and FIGS. 11A and 11B, a conductive layer 69 may be formed on the substrate including the first and second peripheral buffer contact holes 66h1 and 66h2. The conductive layer 69 may be formed to include a metal such as tungsten.

Referring to FIGS. 1A and 1B and FIGS. 12A and 12B, first and second peripheral interconnection structures 72p1 and 72p2 and an adjacent interconnection 72p3 may be formed in the peripheral region PA by patterning the conductive layer 69, while a cell conductive pattern 72c is formed in the cell region CA.

The first peripheral interconnection structure 72p1 may be electrically connected to the first peripheral contact plug 60p1, and the second peripheral interconnection structure 72p2 may be electrically connected to the second peripheral contact plug 60p2. One or more adjacent interconnections 72p3 may be formed between the first and second peripheral interconnection structures 72p1 and 72p2.

The first peripheral interconnection structure 72p1 may include a first buffer plug part 72p_1p filling the first peripheral buffer contact hole 66h1, and a first contact part 72p_1c disposed on the first buffer plug part 72p_1p, and a first line part 72p_1i laterally extending from a part of the first contact part 72p_1c.

The second peripheral interconnection structure 72p2 may include a second buffer plug part 72p_2p filling the second peripheral buffer contact hole 66h2, a second contact part 72p_2c disposed on the second buffer plug part 72p_2p, and a second line part 72p_2i laterally extending from a part of the second contact part 72p_2c. The cell conductive pattern 72c may be formed to overlap an upper surface of the cell upper contact plug 60c and an upper surface of an adjacent bitline capping pattern 36c.

Meanwhile, the buffer insulating layer 63 may be patterned while the conductive layer 69 is patterned. Accordingly, the patterned buffer insulating layer 63a may remain at bottom regions of the first and second line parts 72p_1i and 72p_2i and the first and second contact parts 72p_1c and 72p_2c.

Referring again to FIGS. 2A and 2B, an insulating layer may be formed on the substrate including the first and second peripheral interconnection structures 72p1 and 72p2, the adjacent interconnection 72p3, and the cell conductive pattern 72c, and an insulating pattern 75 may be formed by planarizing the insulating layer to expose upper surfaces of the first and second peripheral interconnection structures 72p1 and 72p2, the adjacent interconnection 72p3, and the cell conductive pattern 72c.

Next, a capacitor structure 87 including a lower electrode 78, a capacitor dielectric layer 81, and an upper electrode 84 may be formed in the cell region CA. The lower electrode 78 may be in contact with and electrically connected to the cell conductive pattern 72c.

An upper interlayer insulating layer 90 covering the cell region CA and the peripheral region PA may be formed on the substrate including the capacitor structure 87.

A cell upper plug 93c passing through the upper interlayer insulating layer 90 may be formed in the cell region CA. A first peripheral upper plug 93p1 passing through the upper interlayer insulating layer 90 and in contact with and electrically connected to the first contact part 72p_1c of the first peripheral interconnection structure 72p1, and a second peripheral upper plug 93p2 in contact with and electrically connected to the second contact part 72p_2c of the second peripheral interconnection structure 72p2 may be formed in the peripheral region PA.

A cell metal interconnection 96c may be formed on the cell upper plug 93c, and a first peripheral metal interconnection 96p1 on the first peripheral upper plug 93p1 and a second peripheral metal interconnection 96p2 on the second peripheral upper plug 93p2 may be formed.

Figure 13:
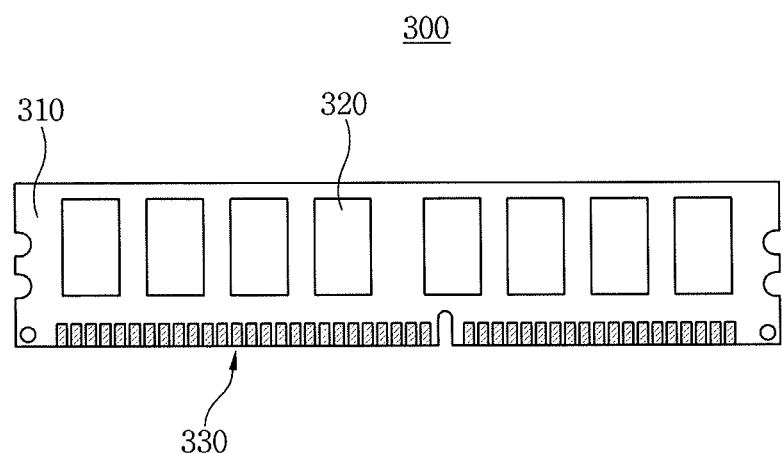
FIGS. 13 and 14 are diagrams schematically showing semiconductor modules including a semiconductor device in accordance with embodiments.

FIG. 13 is a diagram schematically showing a semiconductor module 300 including a semiconductor device in accordance with embodiments.

Referring to FIG. 13, the semiconductor module 300 may be a memory module including a memory device. The semiconductor module 300 may include a module substrate 310, and a plurality of semiconductor devices 320, and a plurality of terminals 330 disposed on the module substrate 310. The terminals 330 may include a conductive metal. The terminals 330 may be electrically connected to the semiconductor devices 320.

The module substrate 310 may be a memory module substrate. The module substrate 310 may include a PCB or a wafer.

The semiconductor devices 320 may be memory devices. The semiconductor devices 320 may be DRAM devices. The semiconductor devices 320 may be a semiconductor device according to an embodiment, or a semiconductor package including the semiconductor device.

Figure 14:
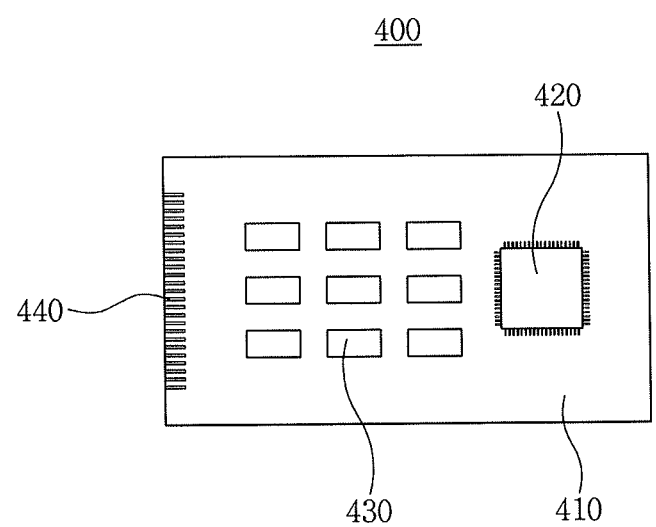

FIG. 14 is a diagram schematically showing a semiconductor module 400 including a semiconductor device in accordance with embodiments.

Referring to FIG. 14, the semiconductor module 400 may include a semiconductor device 430 formed on a module substrate 410. The semiconductor device 430 may be a semiconductor device according to an embodiment, or a semiconductor package including the semiconductor device. For example, the semiconductor device 430 may include the peripheral contact plugs 60p1 and 60p2, the peripheral interconnection structures 72p1 and 72p2, and the adjacent interconnection 72p3 which are disposed on the peripheral region PA, as described in FIGS. 1A and 2A.

The semiconductor module 400 may further include a microprocessor 420 mounted on the module substrate 410. Input/output terminals 440 may be disposed at least at one side of the module substrate 410.

The microprocessor 420 may include the peripheral contact plugs 60p1 and 60p2, the peripheral interconnection structures 72p1 and 72p2, and the adjacent interconnection 72p3 which are disposed on the peripheral region PA, as described in FIGS. 1A and 2A.

Figure 15:
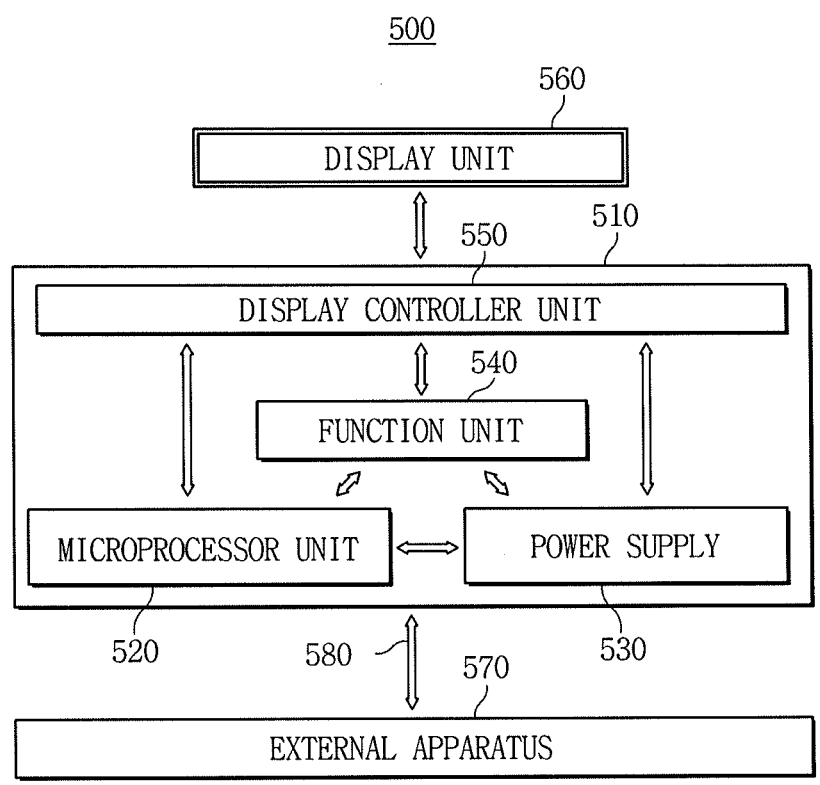
FIG. 15 is a block diagram conceptually showing an electronic system including a semiconductor device in accordance with an embodiment.

FIG. 15 is a block diagram conceptually illustrating an electronic system 500 including a semiconductor device in accordance with an embodiment.

Referring to FIG. 15, the electronic system 500 may include a body 510. The body 510 may include a microprocessor unit 520, a power supply 530, a function unit 540, and/or a display controller unit 550. The body 510 may be a system board or motherboard including a printed circuit board (PCB).

The microprocessor unit 520, for example, may include a semiconductor device including the structure, such as the peripheral contact plugs 60p1 and 60p2, interconnection structures 72p1 and 72p2, and adjacent interconnection 72p3 disposed on the peripheral region PA which are described in FIGS. 1A and 2A.

The microprocessor unit 520, the power supply 530, the function unit 540, and the display controller unit 550 may be mounted or installed on the body 510. A display unit 560 may be arranged on a top surface or outside of the body 510. For example, the display unit 560 may be disposed on a surface of the body 510 and display an image processed by the display controller unit 550. The power supply 530 may receive a constant voltage from an external power source, etc., divide the voltage into various levels, and supply those voltages to the microprocessor unit 520, the function unit 540, and the display controller unit 550. The microprocessor unit 520 may receive a voltage from the power supply 530 to control the function unit 540 and the display unit 560.

The function unit 540 may perform various functions of the electronic system 500. For example, if the electronic system 500 is a mobile electronic apparatus such as a mobile phone, the function unit 540 may have several components which can perform functions of wireless communication such as dialing, video output to the display unit 560 through communication with an external apparatus 570, and sound output to a speaker, and if a camera is installed, the function unit 540 may function as an image processor.

In other embodiments, when the electronic system 500 is connected to a memory card, etc. in order to expand its capacity, the function unit 540 may be a memory card controller. The function unit 540 may exchange signals with the external apparatus 570 through a wired or wireless communication unit 580.

In addition, when the electronic system 500 needs a universal serial bus (USB), etc. in order to expand its functionality, the function unit 540 may function as an interface controller.

Figure 16:
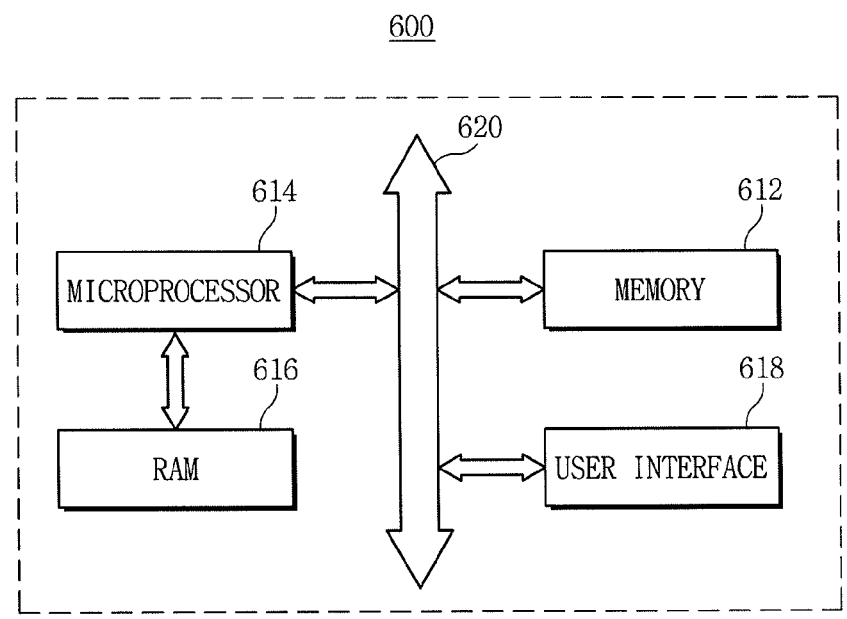
FIG. 16 is a block diagram schematically showing another electronic system including a semiconductor device in accordance with an embodiment.

FIG. 16 is a block diagram schematically showing another electronic system 600 including a semiconductor device in accordance with an embodiment.

Referring to FIG. 16, the electronic system 600 may include a semiconductor device in accordance with an embodiment. The electronic system 600 may be used to fabricate a mobile apparatus or a computer. For example, the electronic system 600 may include a memory system 612, a microprocessor 614, a random access memory (RAM) 616, and a user interface 618 performing data communication using a bus 620. The microprocessor 614 may program and control the electronic system 600. The RAM 616 may be used as an operation memory of the microprocessor 614. The microprocessor 614, the RAM 616, and/or other components can be assembled in a single package. The memory system 612 may include a semiconductor device in accordance with an embodiment.

The user interface 618 may be used to input data to, or output data from the electronic system 600. The memory system 612 may store codes for operating the microprocessor 614, data processed by the microprocessor 614, or external input data. The memory system 612 may include a controller and a memory device.

Figure 17:
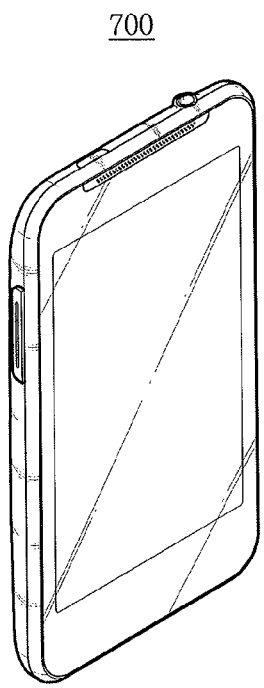
FIG. 17 is a diagram schematically showing a mobile phone including a semiconductor device in accordance with an embodiment.

FIG. 17 is a diagram schematically showing a mobile phone 700 including a semiconductor device in accordance with an embodiment. The mobile phone 700 may include a semiconductor device in accordance with an embodiment. The mobile phone 700 may be understood as a tablet PC. Further, the semiconductor device in accordance with the embodiment may be used in a portable computer such as a laptop computer, an MPEG-1 Audio Layer 3 (MP3) player, an MP4 player, a navigation apparatus, a solid state disk (SSD), a desktop computer, an automobile, or a home appliance, as well as the tablet PC.

According to the embodiments, a semiconductor device that increases a degree of integration, suppresses electrical shorts, and has excellent electrical properties, can be provided. According to the embodiments, a degree of integration of a semiconductor device can be improved by minimizing a distance between contact plugs. According to the embodiments, in order to suppress electrical shorts between contact plugs and interconnections, a buffer plug part in contact with a part of an upper surface of the contact plug may be formed on each of the contact plugs. By disposing the buffer plug part, electrical shorts between the contact plugs and the interconnections can be prevented. In addition, since a distance between the contact plugs can be minimized by disposing the buffer plug part, a degree of integration of a semiconductor device can be improved.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device, comprising:
   a semiconductor substrate having a contact region;
   an interlayer insulating layer disposed on the semiconductor substrate;
   a buffer insulating layer disposed on the interlayer insulating layer;
   a lower contact plug passing through the interlayer insulating layer and electrically connected to the contact region;
   an interconnection structure disposed on the interlayer insulating layer; and
   an adjacent interconnection disposed on the interlayer insulating layer and spaced apart from the interconnection structure,
   wherein a bottom surface of the interconnection structure includes a first part and a second part that are level with each other, the first part of the bottom surface overlapping a part of an upper surface of the lower contact plug, and the second part of the bottom surface overlapping the interlayer insulating layer,
   wherein the interconnection structure includes a buffer plug part passing through the buffer insulating layer and electrically connected to the lower contact plug, and an interconnection part disposed on the buffer insulating layer and electrically connected to the buffer plug part, and
   wherein a bottom surface of the buffer plug part overlaps the part of the upper surface of the lower contact plug.

2. The semiconductor device of claim 1, further comprising:
   a transistor including a source region, a drain region, a gate dielectric layer, and a gate electrode; and
   an insulating gate capping pattern disposed on the gate electrode,
   wherein:
     the gate electrode is disposed on an active region of the semiconductor substrate,
     the gate dielectric layer is interposed between the active region and the gate electrode,
     the source and drain regions are disposed in the active region located at two sides of the gate electrode, and
     one of the source and drain regions is the contact region.

3. The semiconductor device of claim 2, wherein the buffer insulating layer is interposed between the adjacent interconnection and the insulating gate capping pattern.

4. The semiconductor device of claim 1, wherein a shortest distance between the second part of the bottom surface of the interconnection structure and the adjacent interconnection is larger than a shortest distance between the first part of the bottom surface of the interconnection structure and the adjacent interconnection.

5. The semiconductor device of claim 1, wherein:
   the interconnection structure includes a buffer plug part, a contact part disposed on the buffer plug part, and a line part laterally extending from the contact part,
   the contact part has a greater width than the line part, and
   the buffer plug part has a greater width than the lower contact plug.

6. The semiconductor device of claim 5, further comprising:
   an upper contact plug disposed on the contact part; and
   a metal interconnection disposed on the upper contact plug,
   wherein the upper contact plug is electrically connected to the contact part and has a greater width than the line part.

7. The semiconductor device of claim 1, wherein the upper surface of the lower contact plug has a greater width at a first part, which overlaps the interconnection structure, than at a second part, which does not overlap the interconnection structure.

8. A semiconductor device, comprising:
   a semiconductor substrate having a first contact region and a second contact region;
   a first contact plug disposed on the first contact region of the semiconductor substrate;
   a second contact plug disposed on the second contact region of the semiconductor substrate;
   a first interconnection structure disposed on the first contact plug and including a first buffer plug part and a first interconnection part disposed on the first buffer plug part;
   a second interconnection structure disposed on the second contact plug and including a second buffer plug part and a second interconnection part disposed on the second buffer plug part; and
   an adjacent interconnection disposed between the first and second interconnection parts, the adjacent interconnection being spaced apart and separated from each of the first and second interconnection parts,
   wherein a distance between the first and second buffer plug parts is greater than a distance between the first and second contact plugs,
   wherein a bottom surface of the first buffer plug part includes a first part overlapping a part of an upper surface of the first contact plug, and a second part spaced apart from the first contact plug, and wherein the second part of the bottom surface of the first buffer plug part is further away from the adjacent interconnection than the first part of the bottom surface of the first buffer plug part.

9. The semiconductor device of claim 8, wherein:

a bottom surface of the second buffer plug part includes a first part overlapping a part of an upper surface of the second contact plug, and a second part spaced apart from the second contact plug, and the second part of the bottom surface of the second buffer plug part is further away from the adjacent interconnection than the first part of the bottom surface of the second buffer plug part.

10. The semiconductor device of claim 8, further comprising:

a peripheral transistor disposed on the semiconductor substrate;

a lower interlayer insulating layer disposed on the semiconductor substrate; and a buffer insulating layer disposed on the lower interlayer insulating layer, wherein the peripheral transistor includes:

a peripheral gate electrode disposed on a peripheral active area of the semiconductor substrate, a peripheral gate dielectric disposed between the peripheral gate electrode and the peripheral active area, and a first peripheral impurity area and a second peripheral impurity area which are disposed in the peripheral active area located at two sides of the peripheral gate electrode, and wherein the lower interlayer insulating layer is disposed on the first and second peripheral impurity areas located at the two sides of the peripheral gate electrode.

11. The semiconductor device of claim 10, wherein:

the first contact plug passes through the lower interlayer insulating layer and is in contact with the first peripheral impurity area, the second contact plug passes through the lower interlayer insulating layer and is in contact with the second peripheral impurity area, the first contact region is a part of the first peripheral impurity area in contact with the first contact plug, the second contact region is a part of the second peripheral impurity area in contact with the second contact plug, the first buffer plug part passes through the buffer insulating layer and is in contact with a part of an upper surface of the first contact plug, and the second buffer plug part passes through the buffer insulating layer and is in contact with a part of an upper surface of the second contact plug.

12. The semiconductor device of claim 10, further comprising:

cell transistors disposed on the semiconductor substrate;
bitline structures disposed on the semiconductor substrate;
cell contact plugs disposed between the bitline structures; and
cell conductive patterns disposed on the cell contact plugs, wherein each of the cell transistors includes:

a cell gate electrode buried in a gate trench which crosses a cell active area of the semiconductor substrate, a cell gate dielectric disposed between the cell gate electrode and the cell active area, and a first cell source/drain region and a second cell source/drain region which are disposed in the cell active area located at two sides of the cell gate electrode, wherein the bitline structures are electrically connected to the first cell source/drain regions, wherein a part of each of the bitline structures is disposed substantially at a same level as a part of the peripheral gate electrode, and wherein the cell contact plugs are electrically connected to the second cell source/drain regions.

13. The semiconductor device of claim 12, wherein:

the cell conductive patterns are formed of a same material as the first and second peripheral interconnection structures, each of the cell contact plugs includes sequentially stacked a cell lower contact plug and a cell upper contact plug, and the cell upper contact plug includes a same material as the first and second contact plugs, and the cell lower contact plug is formed of a different material from the first and second contact plugs.

14. A semiconductor device, comprising:

a first contact plug disposed on a first contact region of a semiconductor substrate;

a first buffer plug part disposed on the first contact plug, the first buffer plug part being in electrical contact with the first contact plug, and only a part of a lowermost surface of the first buffer plug part overlapping the first contact plug;

a first interconnection part disposed on the first buffer plug part; and an adjacent interconnection close to the first interconnection part, wherein a central axis of the first buffer plug part is offset with respect to a central axis of the first contact plug, wherein the lowermost surface of the first buffer plug part includes a first part overlapped with the first contact plug, and wherein the lowermost surface of the first buffer plug part includes a second part not overlapped with the first contact plug, the first part being closer to the adjacent interconnection than the second part.

15. The semiconductor device of claim 14, further comprising:

a second contact plug disposed on a second contact region of the semiconductor substrate;

a second buffer plug part disposed on the second contact plug, the second buffer plug part being in electrical contact with and partially overlapped with the second contact plug; and a second interconnection part disposed on the second buffer plug part, a distance between the first and second buffer plug parts being greater than a distance between the first and second contact plugs.

16. The semiconductor device of claim 15, further comprising:

a gate electrode disposed between the first and second contact plugs.

* * * * *